(12) United States Patent
Kouchi et al.

(10) Patent No.: US 10,204,900 B2
(45) Date of Patent: Feb. 12, 2019

(54) SEMICONDUCTOR DEVICE

(71) Applicant: Toshiba Memory Corporation, Tokyo (JP)

(72) Inventors: Toshiyuki Kouchi, Kawasaki Kanagawa (JP); Shinya Okuno, Yokohama Kanagawa (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/672,274

(22) Filed: Aug. 8, 2017

(65) Prior Publication Data

US 2018/0053759 A1 Feb. 22, 2018

(30) Foreign Application Priority Data

Aug. 19, 2016 (JP) .................................. 2016-161067

(51) Int. Cl.
*H01L 27/06* (2006.01)
*H01L 23/48* (2006.01)
*G11C 5/04* (2006.01)
*G11C 5/06* (2006.01)
*G11C 7/10* (2006.01)

(52) U.S. Cl.
CPC ............ *H01L 27/0688* (2013.01); *G11C 5/04* (2013.01); *G11C 5/063* (2013.01); *G11C 7/1012* (2013.01); *G11C 7/1057* (2013.01); *G11C 7/1084* (2013.01); *H01L 23/481* (2013.01)

(58) Field of Classification Search
CPC .......................... H01L 27/0688; H01L 23/481

USPC ........................................................ 327/108
See application file for complete search history.

(56) References Cited

U.S. PATENT DOCUMENTS

| 5,789,906 | A | * | 8/1998 | Mizuide | .................. | G05F 3/30 |
| | | | | | | 323/313 |
| 7,002,128 | B2 | * | 2/2006 | Hedin | .................. | G01J 1/4257 |
| | | | | | | 250/205 |
| 7,154,307 | B2 | | 12/2006 | Pradhan et al. | | |
| 8,148,814 | B2 | | 4/2012 | Furuta et al. | | |
| 9,176,007 | B2 | | 11/2015 | Okada | | |
| 9,627,340 | B2 | | 4/2017 | Kouchi | | |

FOREIGN PATENT DOCUMENTS

| JP | 2013-046101 A | 3/2013 |
| JP | 5319773 B2 | 10/2013 |
| JP | 2014-176040 A | 9/2014 |
| TW | 441114 B | 6/2001 |
| TW | 201316536 A | 4/2013 |

* cited by examiner

*Primary Examiner* — Dinh T Le
(74) *Attorney, Agent, or Firm* — Patterson & Sheridan, LLP

(57) ABSTRACT

A semiconductor device includes a first circuit configured to generate a current corresponding to the input signal, a second circuit configured to generate a voltage corresponding to the current generated by the first circuit, a constant current source, a transistor that includes a drain terminal receiving a current from the constant current source and a gate terminal to which the voltage corresponding to the current generated by the first circuit is applied, and an amplification circuit configured to amplify a difference voltage between a drain voltage of the transistor and a reference voltage and output the amplified difference voltage as an output signal corresponding to the input signal.

18 Claims, 24 Drawing Sheets

SEMICONDUCTOR DEVICE

CROSS-REFERENCE TO RELATED APPLICATION

This application is based upon and claims the benefit of priority from Japanese Patent Application No. 2016-161067, filed Aug. 19, 2016, the entire contents of which are incorporated herein by reference.

FIELD

Embodiments described herein relate generally to semiconductor devices.

BACKGROUND

In semiconductor devices of recent years, signals having different amplitudes are used, so that by transmitting a small-amplitude signal to a circuit in which a large-amplitude signal is used, the power consumption of the entire semiconductor device is reduced.

DETAILED DESCRIPTION

Figure 1:
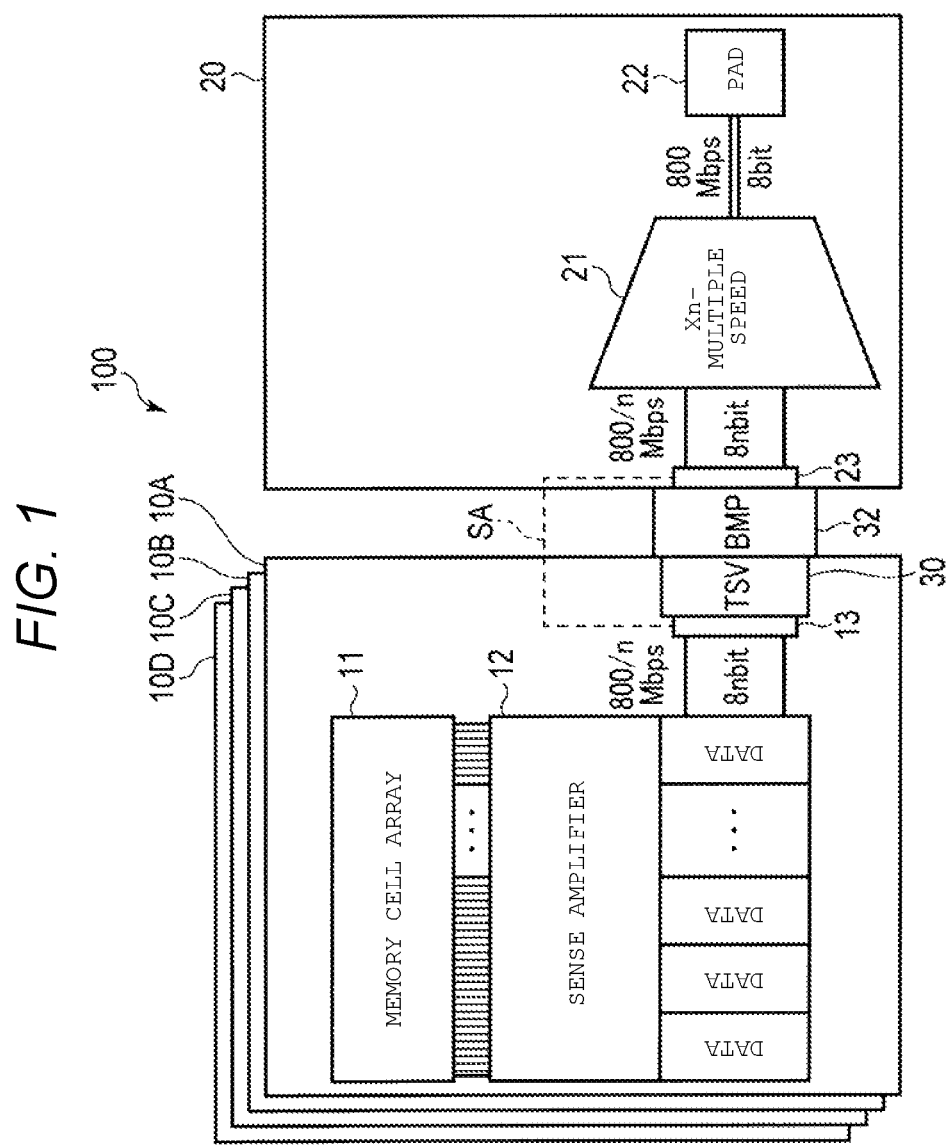
FIG. 1 is a diagram that illustrates the configuration of a semiconductor device according to a first embodiment.

Embodiments provide a semiconductor device with improved operation reliability.

In general, a semiconductor device according to one embodiment includes a first circuit configured to generate a current corresponding to the input signal, a second circuit configured to generate a voltage corresponding to the current generated by the first circuit, a constant current source, a transistor that includes a drain terminal receiving a current from the constant current source and a gate terminal to which the voltage corresponding to the current generated by the first circuit is applied, and an amplification circuit configured to amplify a difference voltage between a drain voltage of the transistor and a reference voltage and output the amplified difference voltage as an output signal corresponding to the input signal.

Hereinafter, semiconductor devices according to embodiments will be described with reference to the drawings. In the description presented below, the same reference numeral is assigned to constituent elements having the same function and the same configuration. In addition, each embodiment illustrated below is an example of a device or a method for realizing the technical idea of the embodiment, and the materials, the shapes, the structures, the arrangement, and the like of the constituent components are not limited to those described below.

1. First Embodiment

1.1 Configuration of Semiconductor Device

The configuration of a semiconductor device according to a first embodiment will be described with reference to FIG. 1.

A semiconductor device 100 according to the embodiment includes a plurality of memory chips (e.g., semiconductor memory chips) 10A, 10B, 10C, and 10D that are stacked and an interface chip (e.g., semiconductor interface chip) 20. Here, an example in which four memory chips are stacked is illustrated, but the number of stacked memory chips is not limited thereto.

A data signal having a small-amplitude voltage level (hereinafter, referred to as a small-amplitude signal) is used for data transmission between each of the memory chips 10A to 10D and the interface chip 20.

The small-amplitude voltage level is, for example, 0.2 V to 0.4 V. A small-amplitude circuit SA including a current drive circuit 13 and a current reception circuit 23 transmits small-amplitude signals between each of the memory chips 10A to 10D and the interface chip 20.

In the case illustrated in FIG. 1, the current drive circuit 13 is provided in each of the memory chips 10A to 10D.

A TSV 30 is provided in each of the memory chips 10A to 10D. A bump 32 electrically connects the memory chip 10A and the interface chip 20. The current reception circuit 23 is provided in the interface chip 20. The current reception circuit 23 receives a small-amplitude signal output from the current drive circuit 13 via the TSV 30 and the BMP 32. The small-amplitude circuit SA will be described later in detail.

Each of the memory chips 10A to 10D, for example, includes a NAND flash memory. In other words, each of the memory chips 10A to 10D includes a memory cell array 11, a sense amplifier 12, the current drive circuit 13, and a through silicon via (TSV) 30. The memory cell array 11 of each of the memory chips 10A to 10D includes a plurality of memory cells storing data. The sense amplifier 12 temporarily stores data read from the memory cell array 11 and outputs the stored data. The TSV 30 is provided in each of the memory chips 10A to 10D and is a via electrically connecting an upper face to a lower face of a semiconductor substrate of the memory chips 10A to 10D. The structures of the memory chips 10A to 10D each including the TSV 30 and the interface chip 20 will be described later in detail.

The interface chip 20 includes a multiplexer 21, an input/output pad 22, and the current reception circuit 23. The multiplexer 21 selects one of a plurality of received data and outputs the selected data. The input/output pad 22 is a pad used for inputting data from the outside (for example, a controller that can access the memory chips 10A to 10D) into the interface chip 20 and outputting data from the interface chip 20 to the outside.

A bus transmitting data (e.g., small-amplitude signal) is provided between the sense amplifier 12 and the current drive circuit 13 of each of the memory chips 10A to 10D and between the current reception circuit 23 and the multiplexer 21. These buses, for example, have a bus width of 8 n (where, n is a natural number) bits. Each of the memory chips 10A to 10D outputs data with a bus width of 8 n bits. The current drive circuit 13 transmits the output data to the current reception circuit 23 via the TSV 30 and the BMP 32. The current reception circuit 23 outputs transmitted data to the bus provided between the current reception circuit 23 and the multiplexer 21.

Hereinafter, the structures of the memory chips 10A to 10D that are stacked and the interface chip 20 will be described with reference to FIGS. 2 and 3.

Figure 2:
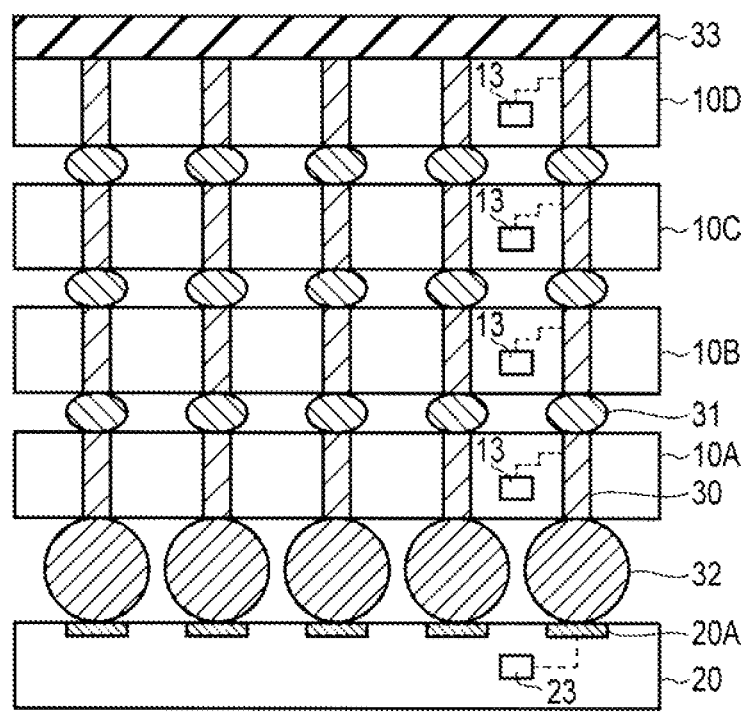
FIG. 2 is a cross-sectional view that illustrates the structure of the semiconductor device according to the first embodiment.

As illustrated in FIG. 2, on the interface chip 20, a plurality of memory chips 10A, 10B, 10C, and 10D are sequentially stacked from the lower side (the interface chip 20 side). On the memory chip 10D, an insulating layer 33 is provided.

In each of the memory chips 10A to 10D, the TSV 30 is provided. The TSV 30 electrically connects the upper face to the lower face of each memory chip. A bump 31 is provided between TSVs 30 of the memory chips 10A to 10D that are adjacent to each other. The TSV 30 and the bump 31 electrically connect the memory chips 10A to 10D.

On an upper face of the interface chip 20, a wiring layer 20A is provided. The bump 32 is provided between the wiring layer 20A and the TSV 30 of the memory chip 10A. The current drive circuit 13 provided in each of the memory chips 10A to 10D outputs a small-amplitude signal to a corresponding TSV 30 through a wiring formed in an insulating film of each of the memory chips 10A to 10D. The current reception circuit 23 receives a small-amplitude signal output to the TSV 30 through the bump 32 and the wiring layer 20A.

Figure 3:
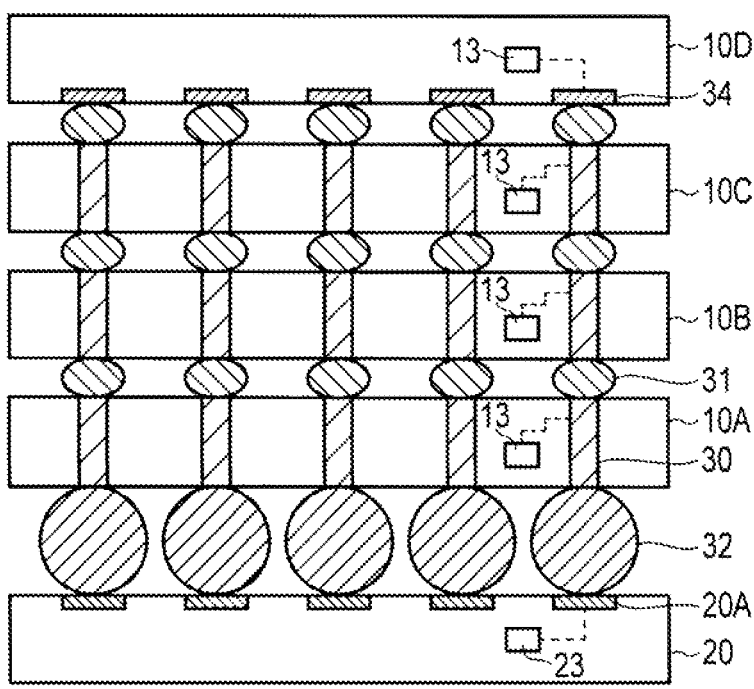
FIG. 3 is a cross-sectional view that illustrates the structure of the semiconductor device according to the first embodiment.

In FIG. 2, while an example in which the memory chip 10D of the uppermost layer includes the TSV 30 is illustrated, as illustrated in FIG. 3, there are cases where the memory chip 10D does not include the TSV 30. The bump 31 is provided between a wiring layer 34 of the lower face of the memory chip 10D and the TSV 30 of the memory chip 10C. The other structures are similar to those illustrated in FIG. 2.

For example, the data (e.g., small-amplitude signal) output from the memory chip 10A is input to the interface chip 20 via the TSV 30 and the bump 32. In addition, the data output from the memory chip 10B is input to the interface chip 20 via the TSV 30 of the memory chip 10B, the bump 31, the TSV 30 of the memory chip 10A, and the bump 32.

While a case is illustrated in FIG. 3 in which the element faces of the memory chips 10A to 10C are on the upper side (face up), the element faces of the memory chips 10A to 10C may be on the lower side (face down).

1.2 Operation of Semiconductor Device

In the semiconductor device 100, data is transmitted from each of the memory chips 10A to 10D to the interface chip 20, for example, with a bus width of 8 n bits. This operation will be described with reference to FIG. 1.

First, the data stored in the memory cell array 11 is read by the sense amplifier 12 and is temporarily stored in the sense amplifier 12. The sense amplifier 12 outputs the data that is temporarily stored to the multiplexer 21 of the interface chip 20 via the current drive circuit 13, the TSV 30, the bump 32, and the current reception circuit 23.

More specifically, the sense amplifier 12 outputs data to the current drive circuit 13, for example, at a transmission speed of 800/n Mbps, for example, by using a bus width of 8 n bits. The current drive circuit 13 outputs a small-amplitude signal to the TSV 30 in accordance with the received data. The output small-amplitude signal arrives at the current reception circuit 23 of the interface chip 20. The current reception circuit 23 outputs data corresponding to the received small-amplitude signal to the multiplexer 21. In this way, the multiplexer 21 receives the data output from each memory chip with a bus width of 8 n bits. At this time, the transmission speed is 800/n Mbps. In other words, between the sense amplifier 12 of each memory chip and the multiplexer 21 of the interface chip 20, data is transmitted at a transmission speed of 800/n Mbps with a bus width of 8 n bits.

Thereafter, the multiplexer 21 transmits the received data to the input/output pad 22 at a speed that is multiplied by n times. More specifically, the multiplexer 21 outputs data to the input/output pad 22, for example, at a transmission speed of 800 Mbps with a bus width of 8 bits.

1.3 Configuration of Small-Amplitude Circuit SA

Figure 4:
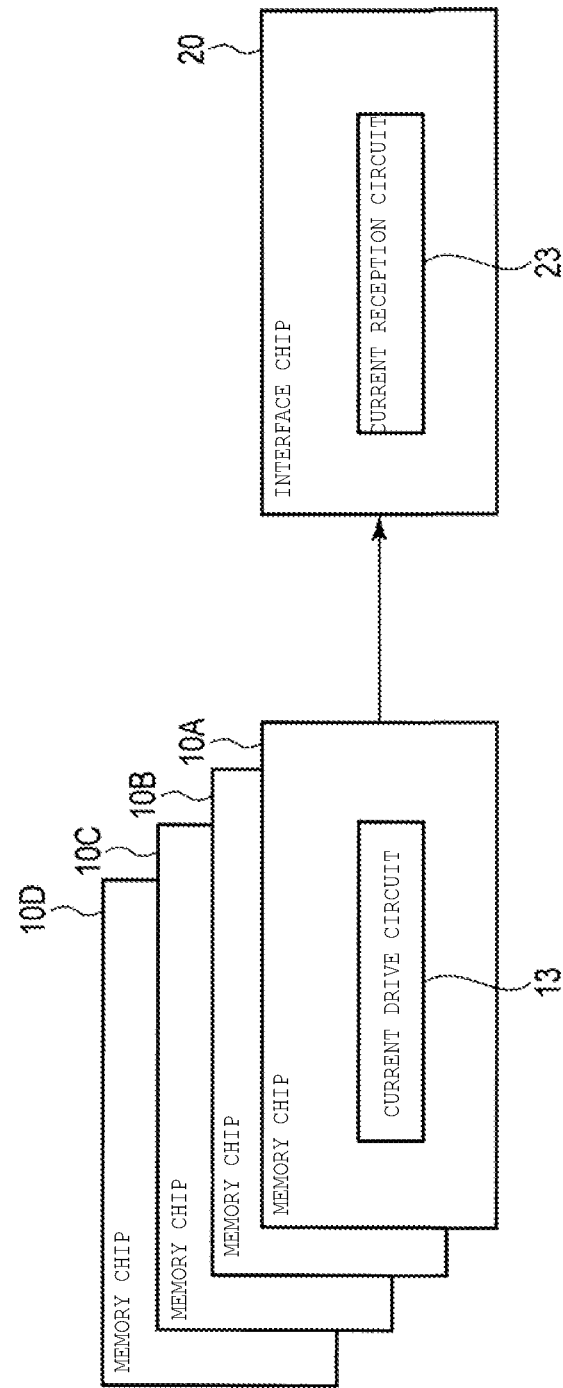
FIG. 4 is a diagram that illustrates a semiconductor device in which a current drive circuit is provided in a memory chip, and a current reception circuit is provided in an interface chip.
Figure 5:
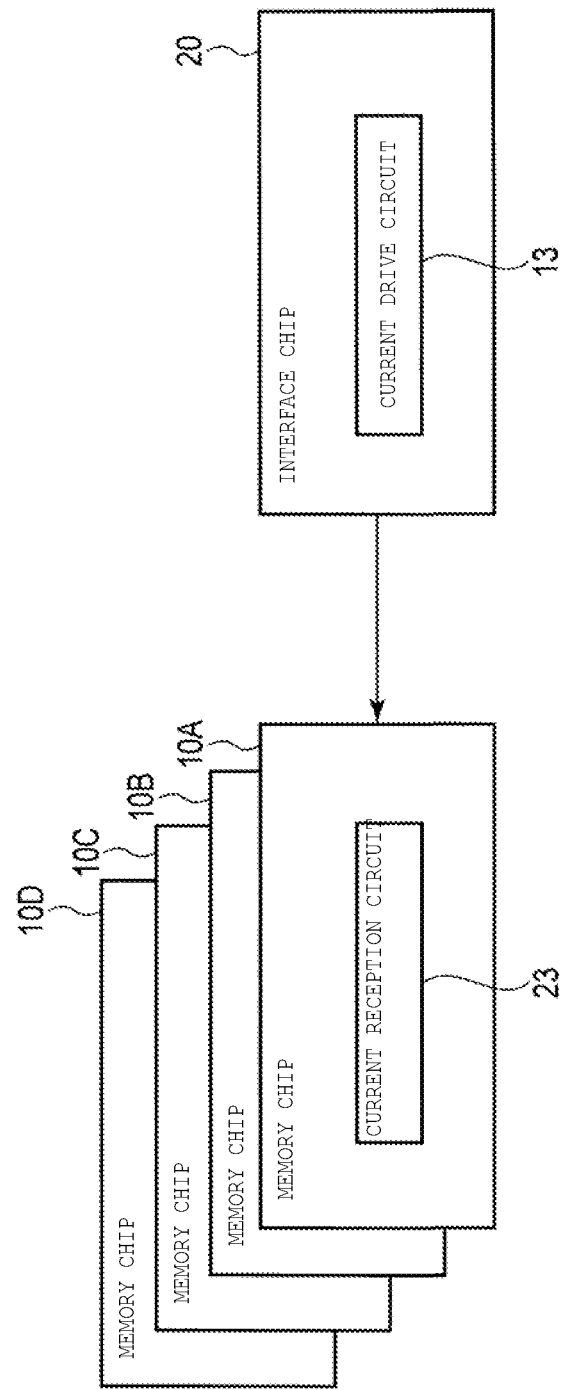
FIG. 5 is a diagram that illustrates a semiconductor device in which the current reception circuit is provided in the memory chip, and the current drive circuit is provided in the interface chip.
Figure 6:
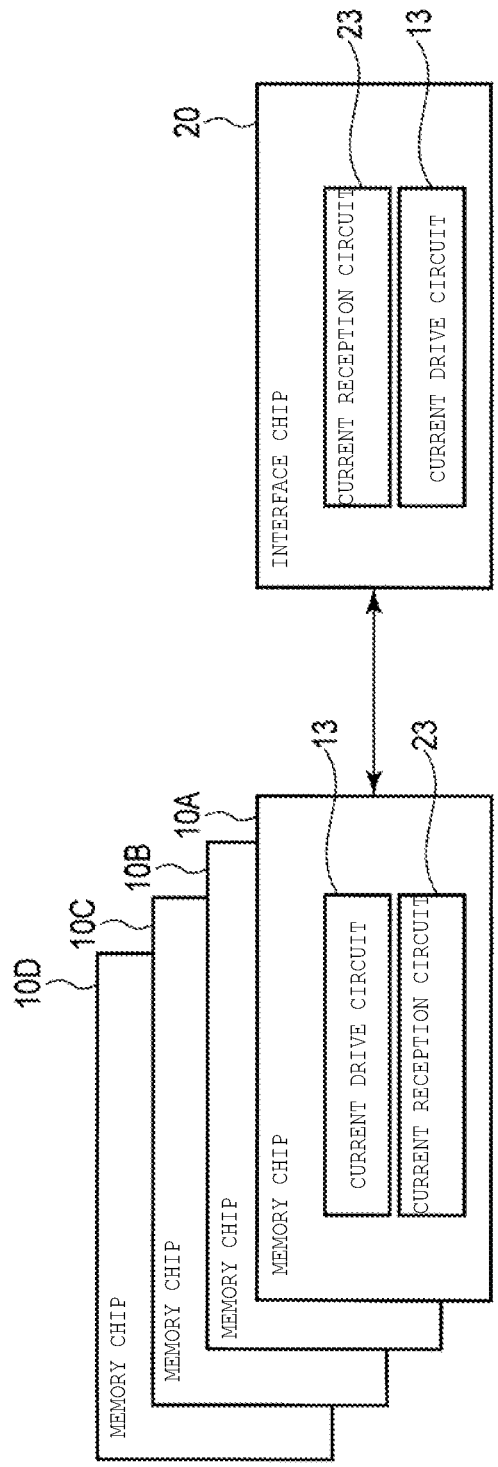
FIG. 6 is a diagram that illustrates a semiconductor device in which the current drive circuit and the current reception circuit are provided in the memory chip, and the current drive circuit and the current reception circuit are provided in the interface chip.

A small-amplitude signal may be unidirectionally transmitted between each of the memory chips 10A to 10D and the interface chip 20 or be bidirectionally transmitted therebetween. For example, in a case where a small-amplitude signal is transmitted from each of the memory chips 10A to 10D to the interface chip 20, as illustrated in FIG. 4, each of the memory chips 10A to 10D includes the current drive circuit 13, and the interface chip 20 includes the current reception circuit 23. On the other hand, in a case where a small-amplitude signal is transmitted from the interface chip 20 to each of the memory chips 10A to 10D, as illustrated in FIG. 5, the interface chip 20 includes the current drive circuit 13, and each of the memory chips 10A to 10D includes the current reception circuit 23. In addition, for example, in a case where a small-amplitude signal is bidirectionally transmitted, as illustrated in FIG. 6, each of the memory chips 10A to 10D includes the current drive circuit 13 and the current reception circuit 23, and the interface chip 20 includes the current reception circuit 23 and the current drive circuit 13.

Here, an example of transmission of a small-amplitude signal from the memory chip 10A to the interface chip 20 will be described with reference to FIG. 7. A case where a small-amplitude signal is transmitted from each of the memory chips 10B to 10D to the interface chip 20 and a case where a small-amplitude signal is transmitted from the interface chip 20 to each of the memory chips 10A to 10D are similar to this example.

The small-amplitude circuit SA, as described above, includes the current drive circuit 13 and the current reception circuit 23. The memory chip 10A includes the current drive circuit 13, and the interface chip 20 includes the current reception circuit 23. The TSV 30 is provided in the memory chip 10A and electrically connects the current drive circuit 13 and the current reception circuit 23 via the bump 32.

The current drive circuit 13 includes two n-channel MOS transistors (hereinafter, referred to as nMOS transistors) NM1 and NM2 as constant current sources, an nMOS transistor NM3 to which a small-amplitude signal is input, an nMOS transistor NM4 having a gate terminal to which a voltage that keeps the nMOS transistor NM4 in a constantly On state is input at least at the time of transmission, and a diode D1 including an nMOS transistor.

More specifically, the drain terminal of the nMOS transistor NM1 is connected to a power source Vcc. The gate terminal of the nMOS transistor NM1 is connected to the gate terminal of the nMOS transistor NM2 and is supplied a predetermined voltage used for turning on the nMOS transistor NM1 and the nMOS transistor NM2. The source terminal of the nMOS transistor NM1 is connected to the drain of the nMOS transistor NM3. In the embodiment, the nMOS transistor NM1 is a constant current source causing a current I to flow.

The drain terminal of the nMOS transistor NM3 is connected to the source of the nMOS transistor NM1. A small-amplitude signal is input to the gate terminal of the nMOS transistor NM3. The source terminal of the nMOS transistor NM3 is connected to one end of the diode D1.

The drain terminal of the nMOS transistor NM2 is connected to the power source (Vcc). The gate terminal of the nMOS transistor NM2 is supplied a predetermined voltage that is common to the gate of the nMOS transistor NM1, and the source terminal of the nMOS transistor NM2 is connected to the drain of the nMOS transistor NM4. In the embodiment, the nMOS transistor NM2 is a constant current source causing a current I to flow.

The drain terminal of the nMOS transistor NM4 is connected to the source of the nMOS transistor NM2. The gate terminal of the nMOS transistor NM4 is supplied a voltage used for keeping the nMOS transistor NM4 constantly ON at least during the time of transmission, and the source terminal thereof, similar to the nMOS transistor NM3, is connected to one end of the diode D1.

The diode D1 is an nMOS transistor. The drain terminal and the gate terminal of the diode D1 are connected to the source terminals of the nMOS transistor NM3 and the nMOS transistor NM4. The source terminal of the diode D1 is connected to ground Vss. The gate terminal of this nMOS transistor is electrically connected to the current reception circuit 23 of the memory chip 10A via the TSV 30.

The current reception circuit 23 includes a constant current source J1, an nMOS transistor NM11, and an operational amplifier OP. More specifically, the constant current source J1 operates by receiving power source (Vcc) and supplies a constant current to the drain terminal of the nMOS transistor NM11. Here, the "constant current source" is a power source causing a current to constantly flow.

A current I from the constant current source J1 is input to the drain terminal of the nMOS transistor NM11. The gate terminal is electrically connected to the gate terminal of the nMOS transistor functioning as the diode D1 via the TSV 30. The source terminal of the nMOS transistor NM11 is connected to the ground Vss.

A positive input terminal of the operational amplifier OP is supplied the voltage (Vd) of the drain terminal of the nMOS transistor NM11. A negative input terminal of the operational amplifier OP is supplied a reference voltage REF. An output terminal of the operational amplifier OP outputs a voltage (=Av×(Vd−reference voltage REF)) acquired by multiplying a difference voltage between the voltage applied to the positive input terminal and the voltage applied to the negative input terminal by an amplification factor Av of the operational amplifier OP as an output signal.

Figure 8:
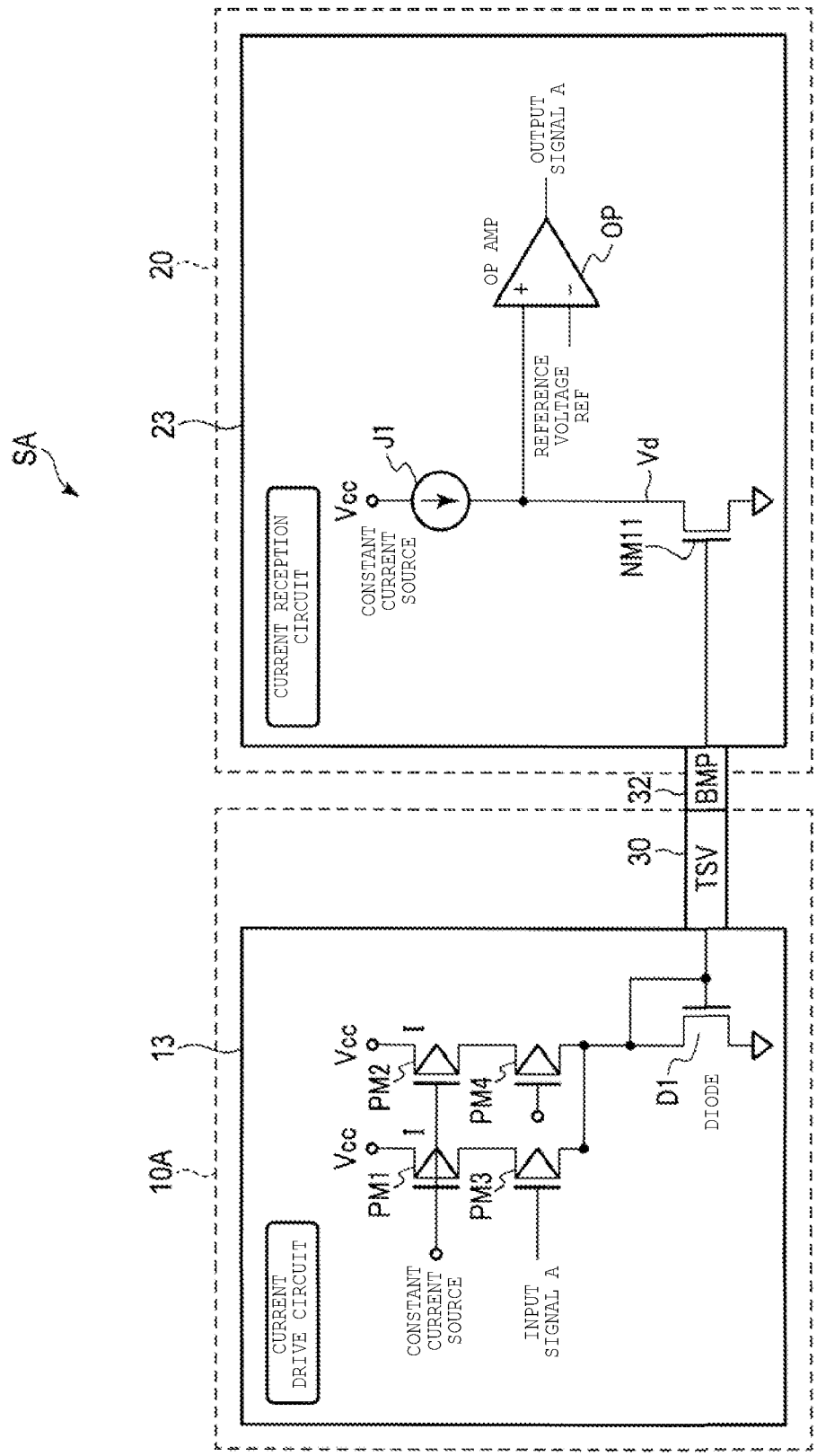
FIG. 8 is a diagram that illustrates a small-amplitude circuit using pMOS transistors according to the first embodiment.

In the embodiment described above, while a case is described in which the nMOS transistors NM1 to NM4 are used, as illustrated in FIG. 8, instead of the nMOS transistors NM1 to NM4, pMOS transistors PM1 to PM4 may be used.

1.4 Operation of Small-Amplitude Circuit

Figure 9:
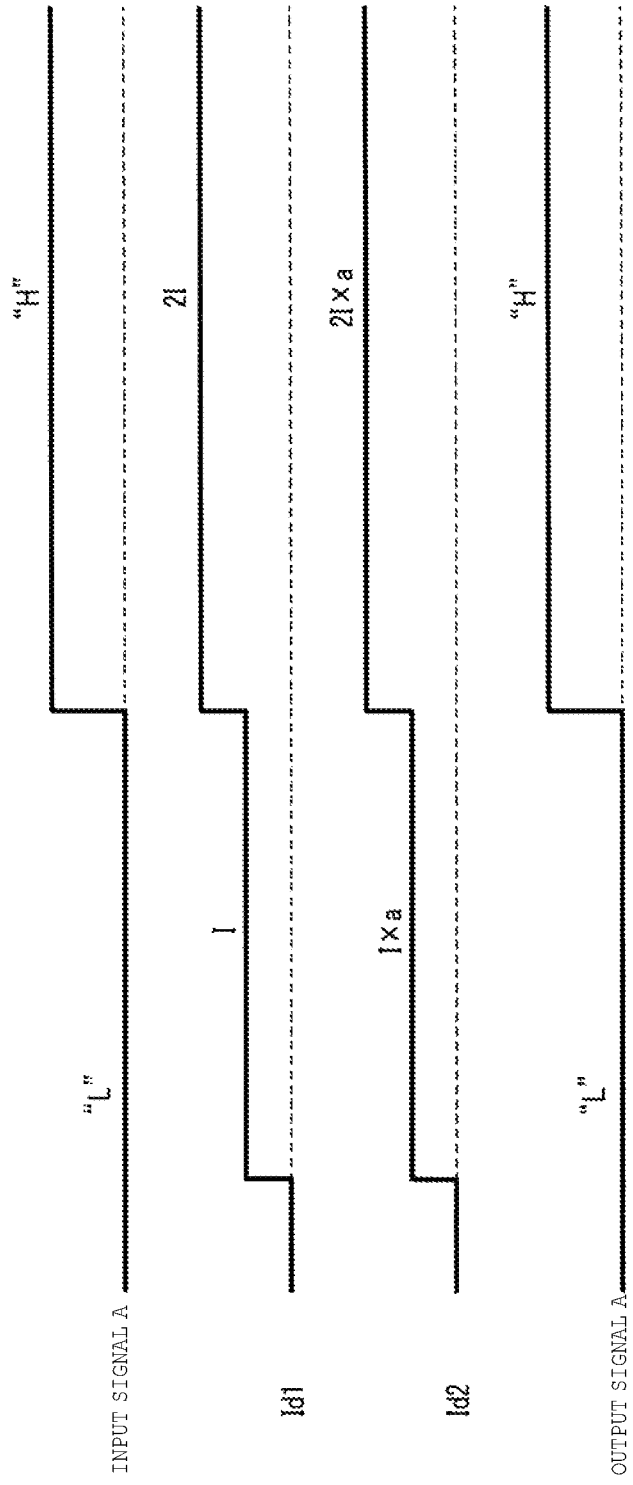
FIG. 9 is a timing chart that illustrates the operation of the small-amplitude circuit.

Next, the operation of the small-amplitude circuit SA illustrated in FIG. 7 will be described. FIG. 9 is a timing chart that illustrates the operation of the small-amplitude circuit SA.

In the current drive circuit 13, an input signal A is input to an input part of the gate of the nMOS transistor NM3.

When the input signal A is "L" (for example, the ground voltage VSS), the nMOS transistor NM3 is in the Off state. The nMOS transistor NM4 is in the On state. Accordingly, in a case where a signal of the "L" level is input as the input signal A, a current Id1 flowing through the diode D1 is I.

When the input signal A is "H", the nMOS transistor NM3 is in the On state. The nMOS transistor NM4 is in the On state. Accordingly, in a case where a signal of the "H" level is input as the input signal A, the current Id1 flowing through the diode D1 is 2I.

A voltage generated between the drain terminal and the gate terminal of the diode D1 is supplied to the gate terminal of the nMOS transistor NM11 via the TSV 30.

In the current reception circuit 23, the transistor NM11 forms a current mirror circuit together with the transistor functioning as a diode. Accordingly, in a case where the input signal A is "L", in other words, in a case where the current Id1 flowing through the diode D1 is I, a current Id2=I×a flows through the nMOS transistor NM11. Here, "a" is a constant of the nMOS transistor NM11. For example, in a case where the transistor NM11 has the same current supply capability as that of the diode-connected transistor (for example, the transistor NM11 has the same channel width as the diode D1 transistor), a=1. On the other hand, in a case where the transistor NM11 has a channel width of the transistor that is twice the channel width of the diode-connected transistor, a=2. In a case where the input signal A is "H", in other words, in a case where the current Id1 flowing through the diode D1 is 2I, a current Id2=2I×a flows through the nMOS transistor NM11.

Accordingly, the voltage of the gate terminal of the nMOS transistor NM11 of a case where the input signal A is "H" is higher than the voltage of the gate terminal of the nMOS transistor NM11 of a case where the input signal A is "L".

In this way, as the output signal A of the operational amplifier OP, in accordance with the voltage (Vd) of the drain terminal of the nMOS transistor NM11, an output signal A="L" is output in a case where the input signal A is "L", and an output signal A="H" is output in a case where the input signal A is "H".

In addition, the reference voltage REF is set such that the input signal A that is a small-amplitude signal can be determined on the output side of the operational amplifier OP. For example, the reference voltage REF may be set to Vd of the nMOS transistor NM11 of a case where the input signal A is "L".

1.5 Effect of First Embodiment

Next, effects relating to the semiconductor device according to the first embodiment will be described.

Figure 10:
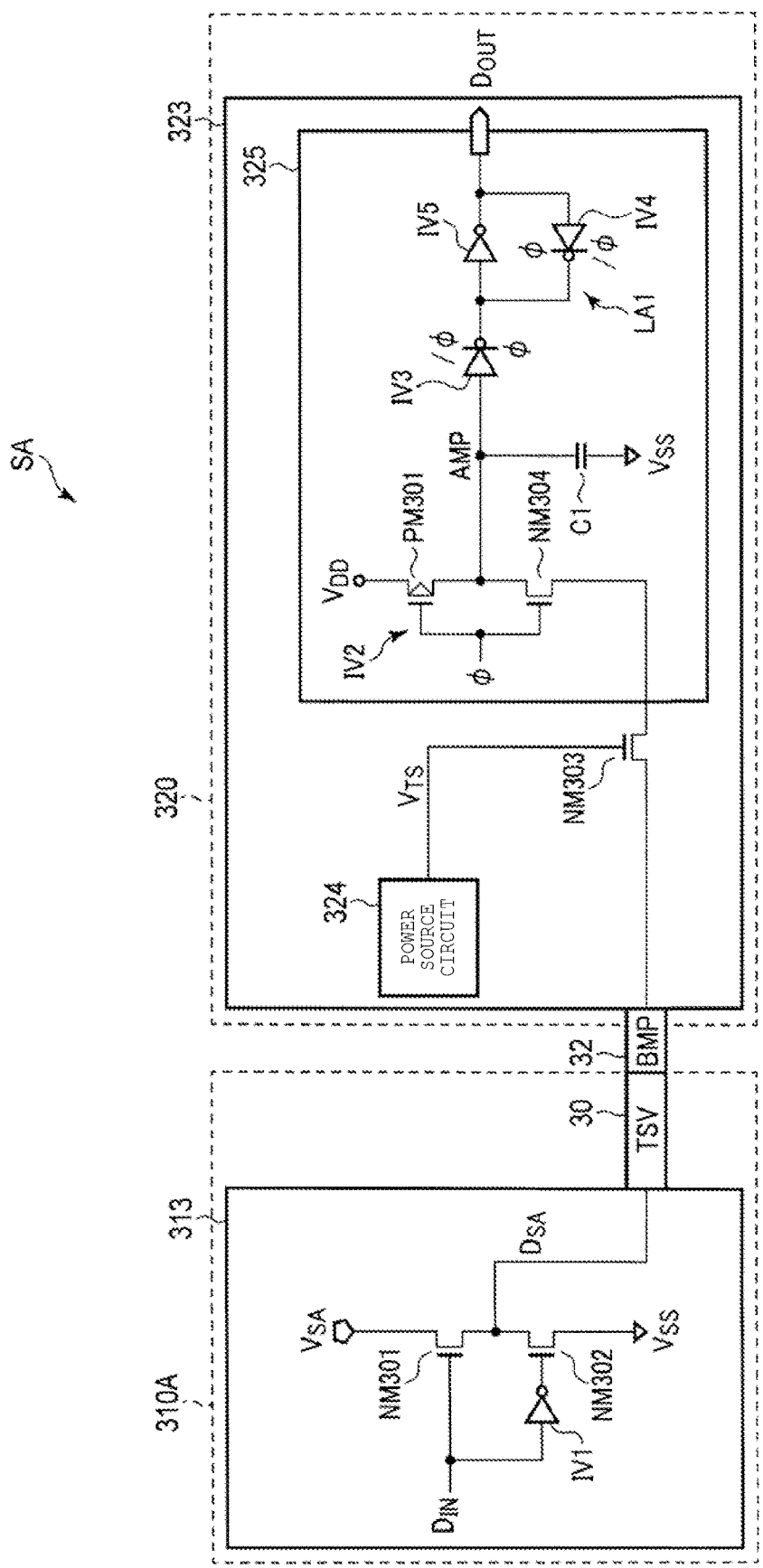
FIG. 10 is a diagram that illustrates the circuit diagram of a small-amplitude circuit of a comparative example.

1.5.1 Comparative Example 1.5.1.1 Configuration of Small-Amplitude Circuit SA of Comparative Example First, a small-amplitude circuit SA as a comparative example will be described. FIG. 10 is a diagram that illustrates the circuit diagram of the small-amplitude circuit SA of the comparative example.

The small-amplitude circuit SA includes a drive circuit 313 and a reception circuit 323. A memory chip 310A includes the drive circuit 313, and an interface chip 320 includes the reception circuit 323. A TSV 30 is provided in the memory chip 310A and electrically connects the drive circuit 313 and the reception circuit 323.

The drive circuit 313 includes nMOS transistors NM301 and NM302 and an inverter IV1. Data DIN is input to the gate of the nMOS transistor NM301 and is input to the gate of the nMOS transistor NM302 via the inverter IV1. The source of the nMOS transistor NM301 is connected to the drain of the nMOS transistor NM302. Small-amplitude voltage VSA is supplied to the drain of the nMOS transistor NM301. Reference voltage, for example, ground voltage Vss is supplied to the source of the nMOS transistor NM302. A connection node of the source of the nMOS transistor NM301 and the drain of the nMOS transistor NM302 is connected to the TSV 30. A small-amplitude signal DSA is output from the connection node to the TSV 30.

The reception circuit 323 includes an nMOS transistor NM303, a power source circuit 324, and an amplification circuit 25. The nMOS transistor NM3 is connected between the TSV 30 and the amplification circuit 325 and configures a transfer gate. The nMOS transistor NM303 is in the On state (which is the transmission state) or the Off state (which is the cutoff state) in accordance with an voltage difference between an adjustment voltage VTS supplied to the gate and the small-amplitude signal DSA input to the source.

The power source circuit 324 generates the adjustment voltage VTS to be supplied to the gate of the nMOS transistor NM303. The power source circuit 324 will be described later in detail.

The amplification circuit 325 includes an inverter IV2, a capacitor C1, a clocked inverter IV3, and a latch circuit LA1. The inverter IV2 includes a p-channel MOS electric field effect transistor (hereinafter, referred to as a pMOS transistor) PM301 and an nMOS transistor NM304. A signal φ is input to the input part of the inverter IV2. A signal φ is input to the gates of the pMOS transistor PM301 and the nMOS transistor NM304. The drain of the nMOS transistor NM303 is connected to the source of the nMOS transistor NM304, and the small-amplitude signal DSA or the ground voltage Vss is input to the source of the nMOS transistor NM304. An internal power source voltage VDD, for example, 1.8 V or 2.0 V is supplied to the source of the pMOS transistor PM301.

The output part of the inverter IV2 is connected to a first electrode of the capacitor C1. Anode between the output part of the inverter IV2 and the first electrode of the capacitor C1 will be referred to as a node AMP. The ground voltage Vss is supplied to a second electrode of the capacitor C1.

In addition, the output part of the inverter IV2 is connected to an input part of the clocked inverter IV3. An output part of the clocked inverter IV3 is connected to an input part of the latch circuit LA1. The latch circuit LA1 includes a clocked inverter IV4 and an inverter IV5. The output part of the clocked inverter IV3 is connected to an output part of the clocked inverter IV4 and an input part of the inverter IV5. An output part of the inverter IV5 is connected to an input part of the clocked inverter IV4. A phase-inverted signal/φ of the signal φ is input to a first control end of the clocked inverter IV3, and the signal φ is input to a second control end thereof. The signal φ is input to a first control end of the clocked inverter IV4, and the signal/φ is input to a second control end thereof. Then, data DOUT is output from an output part of the latch circuit LA1.

Here, while an example is illustrated in which the capacitor C1 is connected to the node AMP, in a case where required electric charge can be stored in parasitic capacitance present in the node AMP, the capacitor C1 may be removed.

1.5.1.2 Configuration of Power Source Circuit of Small-Amplitude Circuit SA of Comparative Example Two circuit examples of the power source circuit 24 will be described with reference to FIGS. 11 and 12.

Figure 11:
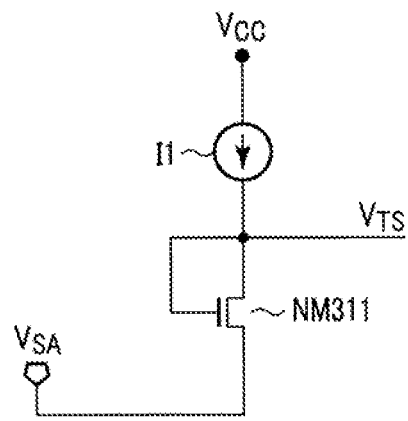
FIG. 11 is a diagram that illustrates the circuit diagram of a first example of a power source circuit of the small-amplitude circuit of the comparative example.

A power source circuit of the first example illustrated in FIG. 11 includes an nMOS transistor NM311 and a constant current source I1. For example, a power source voltage VCC is supplied from the outside to an input part of the constant current source I1, and an output part of the constant current source I1 is connected to the drain and the gate of the nMOS transistor NM311. Small-amplitude voltage VSA is supplied to the source of the nMOS transistor NM311.

In this first example, an adjustment voltage VTS is supplied to the gate of the nMOS transistor NM303 from a connection node between the output part of the constant current source I1 and the drain and the gate of the nMOS transistor NM311. Since the small-amplitude voltage VSA is supplied to the source of the nMOS transistor NM311, the adjustment voltage VTS is a voltage higher than the small-amplitude voltage VSA by a threshold voltage Vth of the nMOS transistor NM311. The nMOS transistor NM311 has the same threshold voltage Vth as the threshold voltage Vth of the nMOS transistor NM303.

Figure 12:
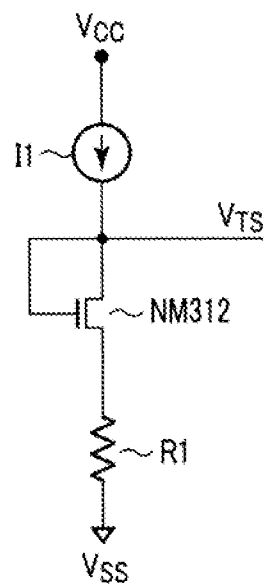
FIG. 12 is a diagram that illustrates the circuit diagram of a second example of a power source circuit of the small-amplitude circuit of the comparative example.

A power source circuit of the second example illustrated in FIG. 12 includes an nMOS transistor NM312, a resistor R1, and a constant current source I1. For example, power source voltage VCC is supplied from the outside to an input part of the constant current source I1, and an output part of the constant current source I1 is connected to the drain and the gate of the nMOS transistor NM312. A reference voltage VSS is supplied to the source of the nMOS transistor NM312 via the resistor R1.

In this second example, an adjustment voltage VTS is supplied to the gate of the nMOS transistor NM303 from a connection node between the output part of the constant current source I1 and the drain and the gate of the nMOS transistor NM312. Here, the resistance value of the resistor R1 is set such that the source of the nMOS transistor NM12 has the small-amplitude voltage VSA. In this way, the adjustment voltage VTS is a voltage higher than the small-amplitude voltage VSA by a threshold voltage Vth of the nMOS transistor NM312. The nMOS transistor NM312 has the same threshold voltage Vth as the threshold voltage Vth of the nMOS transistor NM303.

1.5.1.3 Operation of Small-Amplitude Circuit SA of Comparative Example

Next, the operation of the small-amplitude circuit SA illustrated in FIG. 10 will be described.

In the drive circuit 313, the data DIN is input to the gate of the nMOS transistor NM1 and the input part of the inverter IV1. When the data DIN is "H" (for example, the power source voltage VDD), the nMOS transistor NM301 is in the On state, and the nMOS transistor NM302 is in the Off state. Accordingly, a signal of the "H" level as the small-amplitude signal DSA, in other words, the small-amplitude voltage VSA is output to the TSV 30. On the other hand, when the data DIN is "L" (for example, the ground voltage Vss), the nMOS transistor NM301 is in the Off state, and the nMOS transistor NM302 is in the On state. Accordingly, a signal of the "L" level as the small-amplitude signal DSA, in other words, the ground voltage Vss is output to the TSV 30. The small-amplitude signal DSA output from the drive circuit 313 is transmitted to the source of the nMOS transistor NM303 of the reception circuit 323 via the TSV 30.

Figure 13:
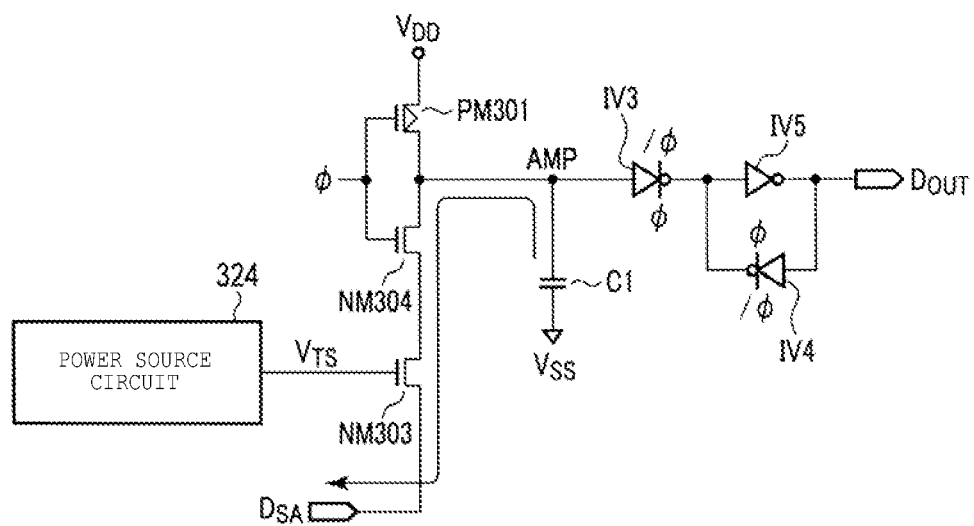
FIG. 13 is a diagram that illustrates an operation of the small-amplitude circuit of the comparative example where a small amplitude signal of the small-amplitude circuit is low.
Figure 14:
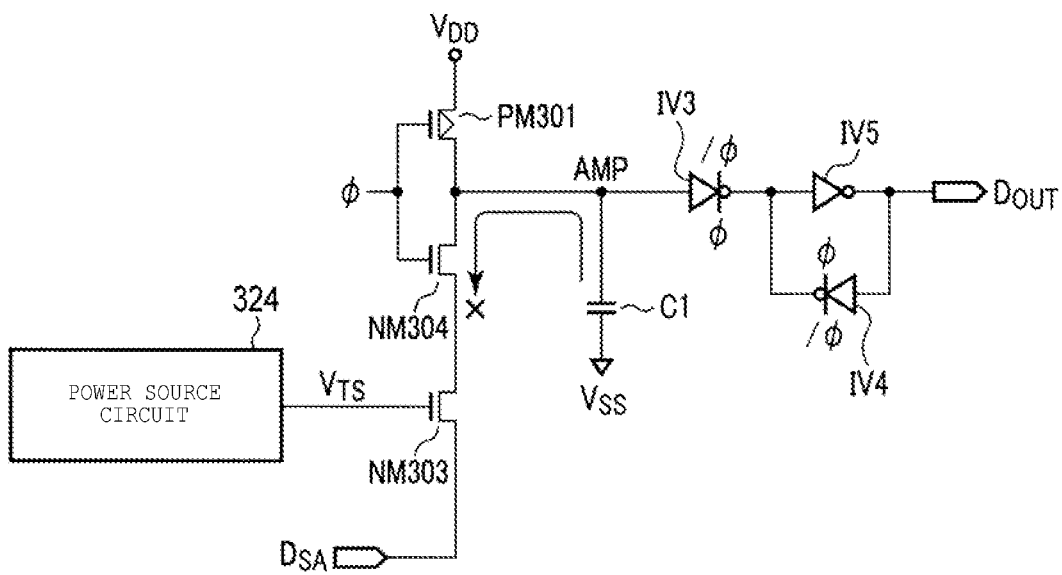
FIG. 14 is a diagram that illustrates an operation of the small-amplitude circuit of the comparative example where the small-amplitude signal of the small-amplitude circuit is high.
Figure 15:
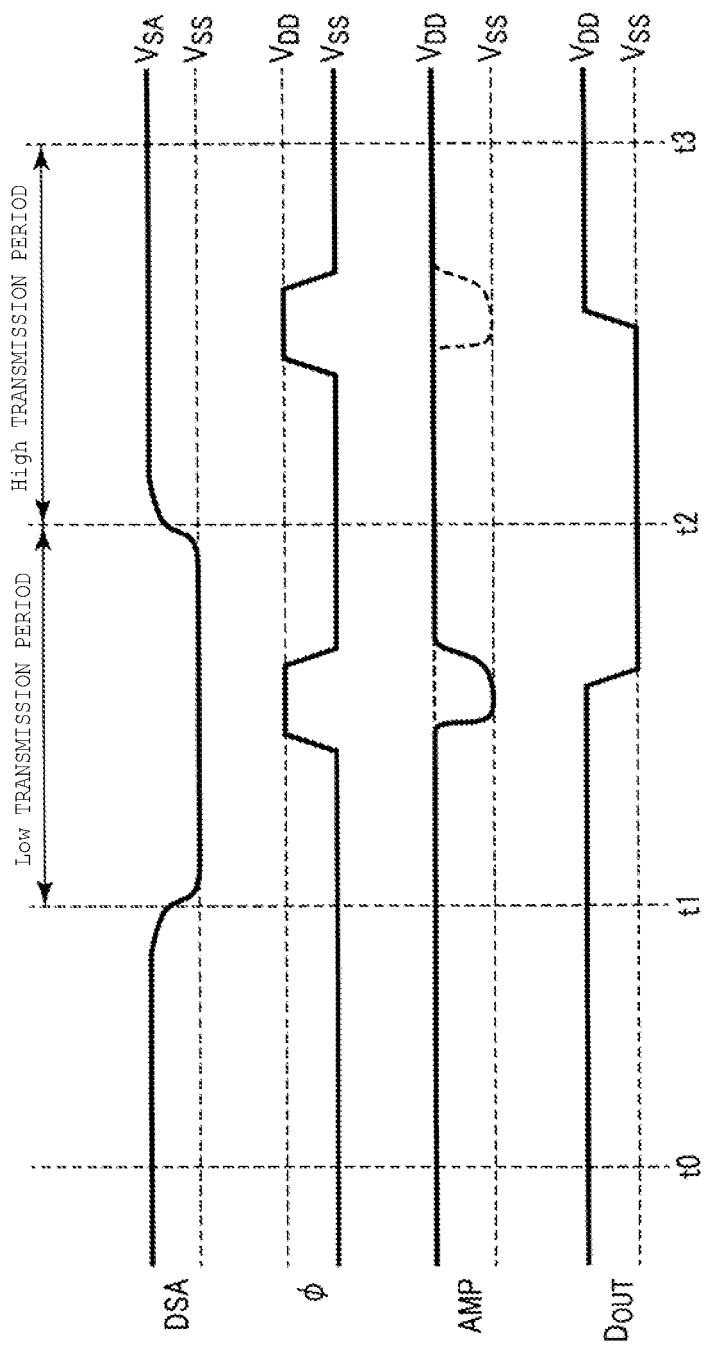
FIG. 15 is a timing chart that illustrates the operation of the small-amplitude circuit of the comparative example.

Next, the operation of the reception circuit 123 of the small-amplitude circuit SA of the comparative example will be described with reference to FIGS. 13 to 15. FIG. 13 is a diagram that illustrates the operation of a case where a small amplitude signal DSA of the small-amplitude circuit SA of the comparative example is "L" (ground voltage Vss) (a period t1 to t2 illustrated in FIG. 15). FIG. 14 is a diagram that illustrates the operation of a case (a period t2 to t3 illustrated in FIG. 15) where the small-amplitude signal DSA of the small-amplitude circuit SA of the comparative example is "H" (small-amplitude voltage VSA). FIG. 15 is a timing chart that illustrates the operation of the small-amplitude circuit SA of the comparative example.

First, as illustrated at time t0 in FIG. 15, the signal φ is set to "L", the pMOS transistor PM301 is in the On state, and the nMOS transistor NM304 is in the Off state. In addition, the clocked inverter IV3 is in the Off state. Accordingly, the capacitor C1 is charged up to the "H" level, and the node AMP is precharged to "H". In FIG. 15, a period in which the signal φ is "L" is a precharge period.

Next, a case where "L" (e.g., the ground voltage Vss) as the small-amplitude signal DSA is transmitted to the source of the nMOS transistor NM303 (a period t1 to t2) will be described with reference to FIG. 13. The power source circuit 324 supplies the adjustment voltage VTS acquired by adding the small-amplitude voltage VSA and the threshold voltage Vth of the nMOS transistor NM303 to the gate of the nMOS transistor NM303. For this reason, the gate-to-source voltage of the nMOS transistor NM303 is "VSA+Vth", and the nMOS transistor NM303 is in the On state.

Here, when the signal φ is set to "H", the pMOS transistor PM301 is in the Off state, the nMOS transistor NM304 is in the On state, and the clocked inverter IV3 is in the On state. For this reason, the voltage charged in the capacitor C1 is discharged through the nMOS transistors NM304 and NM303. Accordingly, the voltage of the node AMP is "L", and the voltage "L" of the node AMP is latched by the latch circuit LA1 through the inverter IV3. As a result, "L" (ground voltage Vss) is output from the latch circuit LA1 as the data DOUT.

Next, a case where "H" (e.g., small-amplitude voltage VSA) as the small-amplitude signal DSA is transmitted to the source of the nMOS transistor NM303 (a period t2 to t3) will be described with reference to FIG. 14. The power source circuit 324, similarly, supplies the adjustment voltage VTS acquired by adding the small-amplitude voltage VSA and the threshold voltage Vth of the nMOS transistor NM303 to the gate of the nMOS transistor NM303. For this reason, the gate-to-source voltage of the nMOS transistor NM303 is the threshold voltage Vth, and the nMOS transistor NM303 is in the Off state.

Here, when the signal φ is set to "H", the pMOS transistor PM301 is in the Off state, the nMOS transistor NM304 is in the On state, and the clocked inverter IV3 is in the On state. However, since the nMOS transistor NM303 is in the Off state, the voltage charged in the capacitor C1 is cut off by the nMOS transistor NM303. Accordingly, the voltage of the node AMP maintains "H", and the voltage "H" of the node AMP is latched by the latch circuit LA1 through the inverter IV3. As a result, "H" (the power source voltage VDD) is output from the latch circuit LA1 as the data DOUT. In addition, when the gate-to-source voltage of the nMOS transistor NM303 is the threshold voltage Vth, a state in which a small current starts to flow is formed, and accordingly, it may be regarded as the Off state.

As above, when the small-amplitude signal DSA is "L", the nMOS transistor NM3 is in the On state, "H" that is pre-charged in the node AMP is discharged, and the node AMP becomes "L". Accordingly, the latch circuit LA1 maintains and outputs "L".

When the small-amplitude signal DSA is "H", the nMOS transistor NM303 is in the Off state, and "H" that is pre-charged in the node AMP is maintained. Accordingly, the latch circuit LA1 maintains and outputs "H".

1.5.2 Effect of First Embodiment

According to the small-amplitude circuit SA of the semiconductor device according to the first embodiment, the voltage of the input signal A that is a small-amplitude signal can be detected based on a current. More specifically, in the current drive circuit 13, the current Id1 flowing through the diode D1 from the constant current source (NM1 and NM2) changes in accordance with "H" or "L" of the input signal A (Id1=2I or I). Accordingly, the current Id2 flowing through the nMOS transistor NM11 of the current reception circuit 23 changes (Id2=I×a or 2I×a), and it can be detected whether the input signal A is "H" or "L".

On the other hand, in the small-amplitude circuit SA of the comparative example, since the "H" or "L" of the input signal Din is detected using the voltage amplitude of the input signal that is a small-amplitude signal as the reference, there is an influence on the voltage amplitude. For example, in a semiconductor storage device using a small-amplitude circuit, in a case where the reception circuit 123 is mounted in a memory chip, when a software programming/reading/erasing operation is performed, a large current flows, and accordingly, in a memory chip disposed far from a power source terminal, according to the influence of the reception circuit, the supply voltage is lowered, and the ground voltage Vss rises. In the small-amplitude circuit SA of the comparative example, the determination of "H" or "L" of the input signal Din is performed by drawing a cutoff margin from the amplitude of voltage Vss. For this reason, when the ground voltage Vss rises, the determination margin of the "L" level of the input signal Din is decreased.

In addition, in a case where the drive circuit 113 is mounted in the memory chip, when the ground voltage Vss rises, the driving capability of the input signal Din is decreased. In addition, the reception margin of the input signal Din in the reception circuit 123 is decreased.

According to the first embodiment, since "H" or "L" of the input signal A can be determined based on the current, the influence of variations of the ground voltage Vss of the current drive circuit 13 and the current reception circuit 23 can be decreased. Accordingly, there is no decrease in the determination margin of the "L" level of the input signal A, and data can be correctly read.

In addition, since it is difficult to receive the influence of variations of the ground voltage Vss, the driving capability of the input signal A is not influenced, and the reception margin of the input signal in the reception circuit 123 is not decreased.

According to the first embodiment, in data transmission between each of the memory chips 10A to 10D and the interface chip 20, the data transmission is performed between each of the memory chips 10A to 10D and the TSV 30 and between the TSV 30 and the interface chip 20 with a same bus width by using the TSV 30. Accordingly, the circuit area of the memory chips 10A to 10D can be reduced.

Figure 16:
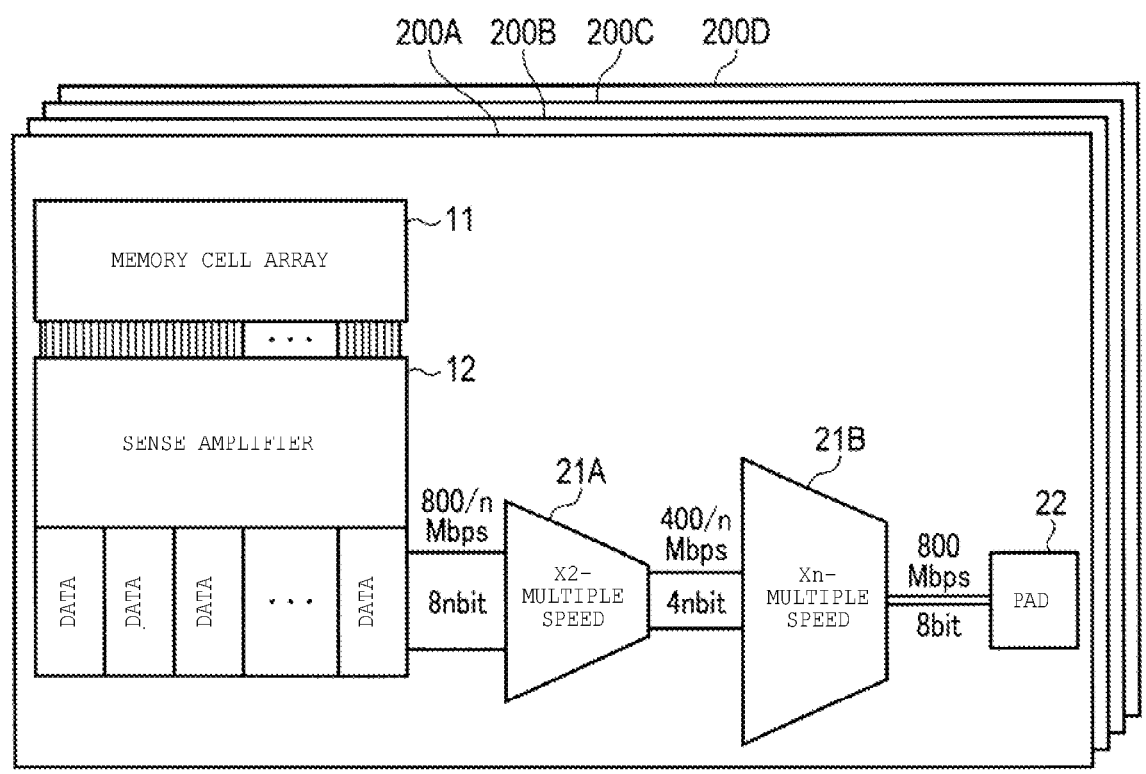
FIG. 16 is a diagram that illustrates the configuration of a semiconductor device of a comparative example for describing the effects of the semiconductor device according to the first embodiment.

Hereinafter, regarding this point, by using a comparative example illustrated in FIG. 16, the effects of the first embodiment will be described in detail. In the comparative example, a plurality of semiconductor devices 200A, 200B, 200C, and 200D are stacked. Each of the semiconductor devices 200A to 200D includes a memory cell array 11, a sense amplifier 12, multiplexers 21A and 21B, and an input/output pad 22 on a semiconductor chip. The sense amplifier 12 outputs data to the multiplexer 21A by using a bus width of 8 n bits. The multiplexer 21A selects the received data and outputs the selected data to the multiplexer 21B by using a bus width of 4 n bits. In addition, the multiplexer 21B selects the received data and outputs the selected data to the input/output pad 22 by using a bus width of 8 bits. However, in such semiconductor devices 200A to 200D, the multiplexers, the input/output pad, and the like are arranged in each of the semiconductor devices 200A to 200D, and a TSV is not used for an inter-chip connection. Accordingly, the area required for the arrangement of the multiplexers, the input/output pad, and the like and the inter-chip connection increases.

In contrast to this, according to the first embodiment, the multiplexer, the input/output pad, and the like are arranged in the interface chip 20 and are used in common to a plurality of the memory chips 10A to 10D, and accordingly, the circuit area of the memory chips 10A to 10D can be decreased.

In addition, according to the first embodiment, since a small-amplitude signal can be transmitted as a single-phase signal, the number of TSVs or the number of signal lines required for the transmission of the small-amplitude signal can be decreased. Accordingly, the circuit area of the memory chips 10A to 10D can be reduced.

For example, there is a method for stably transmitting a small-amplitude signal in which two signal lines are used for transmission of data with a bus width of one bit, and complementary signals (or differential signals) are transmitted through the signal lines. However, in such a case, the number of signal lines are necessarily to be twice the number of bits of the bus width, and accordingly, the method is not appropriate for increasing the number of bits of the bus width. In addition, in the case of a memory chip having a TSV, the TSV is used as a signal line through which data passes, and thus, when the number of used TSVs is large, the area of the memory chip increases.

In contrast to this, according to the first embodiment, a small-amplitude signal can be transmitted not as complementary signals but as a single-phase signal, in other words, one TSV or one signal line may be prepared for a bus width of one bit. Accordingly, the number of TSVs or the number of signal lines required for the transmission of the small-amplitude signal can be decreased. Accordingly, the circuit area of the memory chips can be reduced. In addition, by using the small-amplitude circuit SA described in the embodiment, the small-amplitude signal can be stably transmitted at a high speed.

2. Second Embodiment

In a semiconductor device according to a second embodiment, the configuration of a small-amplitude circuit SA is different from that of the semiconductor device according to the first embodiment. In the small-amplitude circuit SA of the semiconductor device according to the second embodiment, by generating the reference voltage REF via the TSV 30, variations of the ground voltage Vss between the current drive circuit 13 and the current reception circuit 23 are offset.

2.1 Configuration of Small-Amplitude Circuit SA

Figure 17:
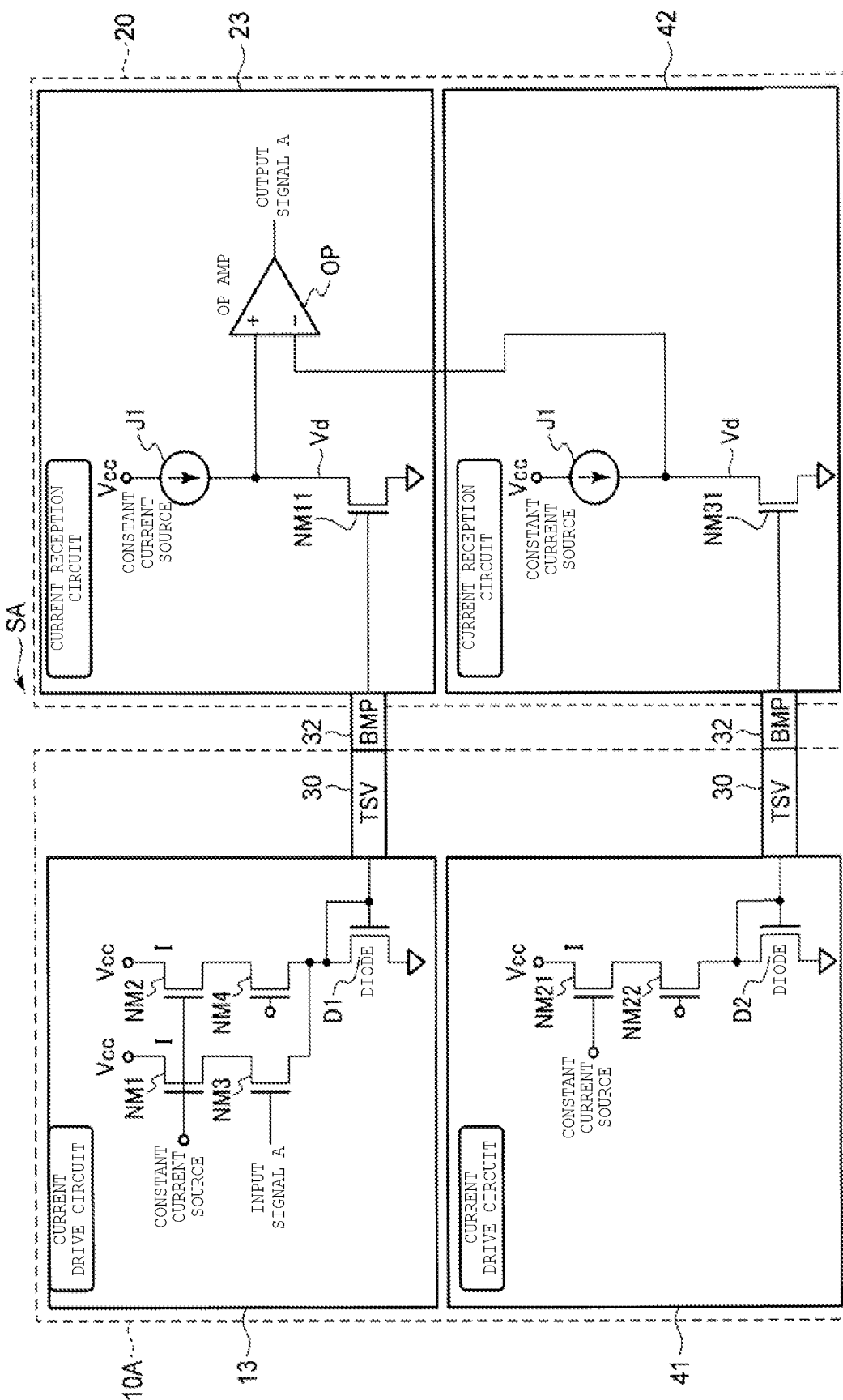
FIG. 17 is a diagram that illustrates a small-amplitude circuit, which uses nMOS transistors, of a semiconductor device according to a second embodiment.

FIG. 17 is a diagram that illustrates a small-amplitude circuit SA, which uses nMOS transistors, of the semiconductor device according to the second embodiment. The configurations of a current drive circuit 13 and a current reception circuit 23 are similar to those according to the first embodiment, and thus, the description thereof will not be presented here.

A current drive circuit 41 for reference voltage REF includes an nMOS transistor NM21 as a constant current source, an nMOS transistor NM22 having a gate terminal to which a voltage that keeps the nMOS transistor NM22 constantly in the On state at least during the time of transmission is input, and a diode D2 including an nMOS transistor. The current drive circuit 41 for the reference voltage REF is formed in a same memory chip 10A as the current drive circuit 13, and a current reception circuit 42 for the reference voltage REF is formed in an interface chip 20 same as the current reception circuit 23.

More specifically, the nMOS transistor NM21 includes a drain terminal connected to a power source (Vcc), a gate terminal to which a predetermined voltage for turning on the nMOS transistor NM21 is applied, and a source terminal connected to the drain of the nMOS transistor NM22. In the embodiment, the nMOS transistor NM21 is a constant current source causing a current I to flow.

The nMOS transistor NM22 includes a drain terminal connected to the source of the nMOS transistor NM21, a gate terminal to which a voltage for constantly keeping the nMOS transistor NM22 on at least during the time of transmission, is applied, and a source terminal connected to one end of a diode D2.

The diode D2 has a drain terminal and a gate terminal connected to the source terminal of the nMOS transistor NM22, has a source terminal connected to the ground voltage Vss, and includes an nMOS transistor.

The current reception circuit 42 used for the reference voltage REF includes a constant current source J1 and an nMOS transistor NM31. More specifically, the constant current source J1 operates by receiving power source (Vcc) and supplies a constant current to the drain terminal of the nMOS transistor NM31.

The nMOS transistor NM31 includes a drain terminal, to which the current I from the constant current source J1 is input, connected to the negative input terminal of an operational amplifier OP, a gate terminal to which the voltage of the gate terminal of the nMOS transistor functioning as the diode D2 is applied via the TSV 30, and a source terminal connected to the ground voltage Vss.

In addition, the current drive circuit 41 and the current reception circuit 42 used for the reference voltage REF according to the second embodiment may be applied also to a third embodiment to a sixth embodiment to be described later.

2.2 Operation of Small-Amplitude Circuit SA

In the current drive circuit 41 used for the reference voltage REF, since the nMOS transistor NM22 is in the On state, the current I from the constant current source flows through the diode D2. Then, the voltage of the gate terminal of the nMOS transistor functioning as the diode D2 is applied to the gate terminal of the nMOS transistor NM31 via the TSV 30.

In the current reception circuit 42 used for the reference voltage REF, a current I×b flows through the nMOS transistor NM31. Here, "b" is a constant of the nMOS transistor NM31.

The drain voltage of the nMOS transistor NM31 is applied to the negative input terminal of the operational amplifier OP.

2.3 Effect of Second Embodiment

According to the second embodiment, the reference voltage REF is generated via the TSV 30 by using the constant current source, and accordingly, compared to the first embodiment, the variations of the ground voltage Vss of the current drive circuits 13 and 41 and the current reception circuits 23 and 42 can be further prevented.

3. Third Embodiment

In a small-amplitude circuit SA of a semiconductor device according to a third embodiment, the current control performed by the current drive circuit 13 is performed not in two stages but in N stages, and accordingly, transmission of N values is performed.

3.1 Configuration of Small-Amplitude Circuit SA

Figure 18:
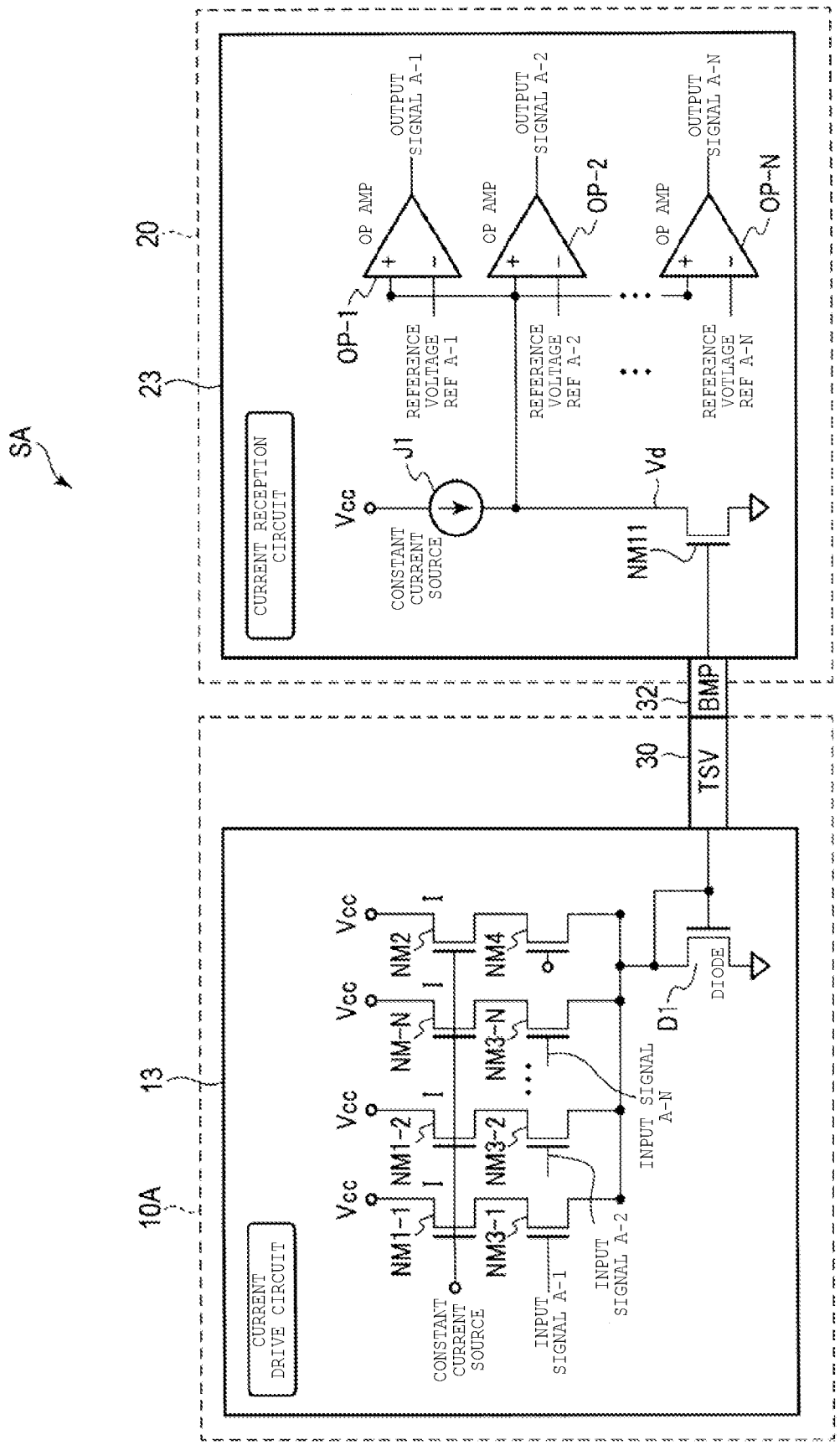
FIG. 18 is a diagram that illustrates a small-amplitude circuit, which uses nMOS transistors, of a semiconductor device according to a third embodiment.

FIG. 18 is a diagram that illustrates a small-amplitude circuit SA, which uses nMOS transistors, of the semiconductor device according to the third embodiment.

A current drive circuit 13 includes n nMOS transistors NM1-1 to NM-N and NM2 as constant current sources, nMOS transistors NM3-1 to NM3-N to which input signals A-1 to A-N that are small-amplitude signals are respectively input, an nMOS transistor NM4 having a gate terminal to which a voltage for constantly keeping the nMOS transistor NM4 in the On state at least during the time of transmission, is input, and a diode D1 including an nMOS transistor. The current drive circuit 13 is formed in a memory chip 10A.

More specifically, the nMOS transistors NM1-1 to NM1-N include drain terminals connected to the power source (Vcc), gate terminals to which predetermined voltages used for turning on the nMOS transistors NM1-1 to NM1-N that are common to the gate of the nMOS transistor NM2 are applied, and source terminals respectively connected to the drains of the nMOS transistors NM3-1 to NM3-N. In the embodiment, the nMOS transistors NM1-1 to NM1-N are constant current sources used for causing the current I to flow.

The nMOS transistors NM3-1 to NM3-N respectively include drain terminals connected to the sources of the nMOS transistors NM1-1 to NM1-N, gate terminals to which input signals A-1 to A-N, which are small-amplitude signals, are input, and source terminals connected to one end of the diode D1.

The nMOS transistor NM2 includes a drain terminal connected to the power source (Vcc), a gate terminal to which a predetermined voltage common to the gate of the nMOS transistor NM1 is applied, and a source terminal connected to the drain of the nMOS transistor NM4. In the embodiment, the nMOS transistor NM2 is a constant current source causing the current I to flow.

The nMOS transistor NM4 includes a drain terminal connected to the source of the nMOS transistor NM2, a gate terminal to which a voltage for constantly keeping the nMOS transistor NM4 on at least during the time of transmission is applied and, similar to the nMOS transistor NM3, a source terminal connected to one end of the diode D1.

The diode D1 is an nMOS transistor having a drain terminal and a gate terminal connected to the source terminals of the nMOS transistors NM3-1 to NM3-N and the nMOS transistor NM4 and a source terminal connected to the ground voltage Vss.

The current reception circuit 23 includes a constant current source J1, an nMOS transistor NM11, and operational amplifiers OP-1 to OP-N. The current reception circuit 23 is formed in the interface chip 20. More specifically, the constant current source J1 operates by receiving the power source (Vcc) and supplies a constant current to the drain terminal of the nMOS transistor NM11.

The nMOS transistor NM11 includes a drain terminal to which the current I from the constant current source J1 is input, a gate terminal to which the voltage of the gate terminal of the nMOS transistor functioning as the diode D1 is applied via the TSV 30, and a source terminal connected to the ground voltage Vss.

The operational amplifiers OP-1 to OP-N respectively include positive input terminals to which the voltage (Vd) of the drain terminal of the nMOS transistor NM11 is applied, negative input terminals to which reference electric potentials REF_A-1 to REF_A-N are applied, and output terminals that respectively output voltages (=Av×(Vd−reference voltage REF)) acquired by multiplying difference voltages between the voltages applied to the positive input terminals (Vd) and the voltages applied to the negative input terminals by the amplification factors Av of the operational amplifiers OP as output signals A-1 to A-N.

The reference electric potentials REF_A-1 to REF_A-N are set to electric potentials for which the operational amplifiers OP-1 to OP-N can determine the number of "H"s of the input signals A-1 to A-N that are small-amplitude signals.

For example, the reference voltage REF_A-1 is the drain terminal voltage Vd of the nMOS transistor NM11 of a case where the voltage of the diode D1 through which the current Id1=2I flows is applied to the gate terminal of the nMOS transistor NM11 via the TSV 30. The reference voltage REF_A-2 is the drain terminal voltage Vd of the nMOS transistor NM11 of a case where the voltage of the diode D1 through which the current Id1=3I flows is applied to the gate terminal of the nMOS transistor NM11 via the TSV 30. The reference voltage REF_A-m is the drain terminal voltage Vd of the nMOS transistor NM11 of a case where the voltage of the diode D1 through which the current Id1=(m+1)×I flows is applied to the gate terminal of the nMOS transistor NM11 via the TSV 30.

3.2 Operation of Small-Amplitude Circuit SA

In the current drive circuit 13 of the small-amplitude circuit SA illustrated in FIG. 18, a current flowing through the diode D1 changes according to the input signals A-1 to A-N. For example, in a case where the input signals A-1 to A-N are "L", the nMOS transistors NM3-1 to NM3-N are in the Off state. The nMOS transistor NM4 is in the On state. Accordingly, in a case where signals of the "L" level are input as the input signals A-1 to A-N, the current Id1 flowing through the diode D1 is I.

When the input signals A-1 to A-N are "H", the nMOS transistors NM3-1 to NM3-N are in the On state. The nMOS transistor NM4 is in the On state. Accordingly, in a case where signals of the "H" level are input as the input signals A-1 to A-N, the current Id1 flowing through the diode D1 is (N+1)×I. Similarly, when m input signals (here, m is a positive integer) among the input signals A-1 to A-N are "H", the current Id1 flowing through the diode D1 is (m+1)×I. In other words, in accordance with the number of input signals that are in the "H" state among the input signals A-1 to A-N, a current flows through the diode D1.

A voltage generated between the drain terminal and the gate terminal of the diode D1 is applied to the gate terminal of the nMOS transistor NM11 via the TSV 30.

In the current reception circuit 23, in a case where the input signals A-1 to A-N are "L", in other words, in a case where the current Id1 flowing through the diode D1 is I, a current Id2=I×a flows through the nMOS transistor NM11. The drain terminal voltage Vd of the nMOS transistor NM11 is a voltage corresponding to the current Id2=I×a. This drain terminal voltage Vd is applied to the positive input terminals of the operational amplifiers OP-1 to OP-N.

The reference electric potentials REF_A-1 to REF_A-N of the operational amplifiers OP-1 to OP-N are set to electric potentials for which the operational amplifiers OP-1 to OP-N can determine the number of "H"s of the input signals A-1 to A-N that are small-amplitude signals. Accordingly, in a case where the input signals A-1 to A-N are "L", the output signals A-1 to A-N="L" are output.

In a case where the input signals A-1 to A-N are "H", in other words, in a case where the current Id1 flowing through the diode D1 is (N+1)×I, a current Id2=(N+1)×I×a flows through the nMOS transistor NM11. The drain terminal voltage Vd of the nMOS transistor NM11 is a voltage corresponding to a current Id2=(N+1)×I×a. This drain terminal voltage Vd is applied to the positive input terminals of the operational amplifiers OP-1 to OP-N. Accordingly, in a case where the input signals A-1 to A-N are "H", the operational amplifiers OP-1 to OP-N output the output signals A-1 to A-N="H".

When m input signals among the input signals A-1 to A-N are "H", the current Id1 flowing through the diode D1 is (m+1)×I. A current Id2=(m+1)×I×a flows through the nMOS transistor NM11. The drain terminal voltage Vd of the nMOS transistor NM11 is a voltage corresponding to a current Id2=(m+1)×I×a. This drain terminal voltage Vd is applied to the positive input terminals of the operational amplifiers OP-1 to OP-N. In a case where m input signals are "H", the output signals A-1 to A-M of m operational amplifiers OP-1 to OP-M are "H", and the output signals A-M+1 to A-N of the operational amplifiers OP-M+1 to OP-N become "L".

3.3 Effect of Third Embodiment

According to the third embodiment, the current control performed in the current drive circuit 13 is performed not in two stages but in N stages, and accordingly, transmission of N values can be performed.

4. Fourth Embodiment

A small-amplitude circuit SA of a semiconductor device according to a fourth embodiment causes a current to flow through a TSV 30, whereby the transmission of a small-amplitude signal is performed.

4.1 Configuration of Small-Amplitude Circuit SA

Figure 7:
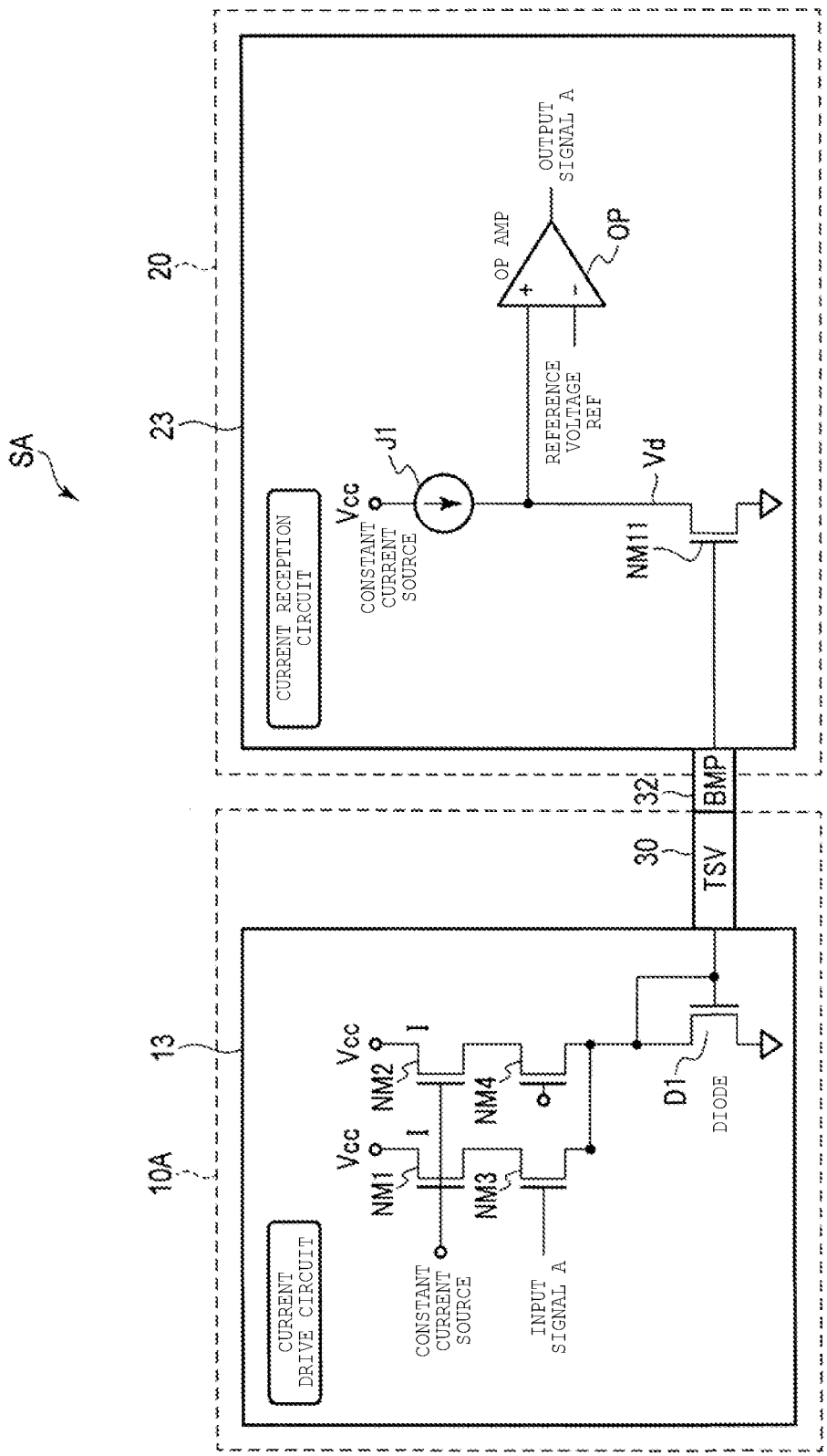
FIG. 7 is a diagram that illustrates a small-amplitude circuit using nMOS transistors according to the first embodiment.
Figure 19:
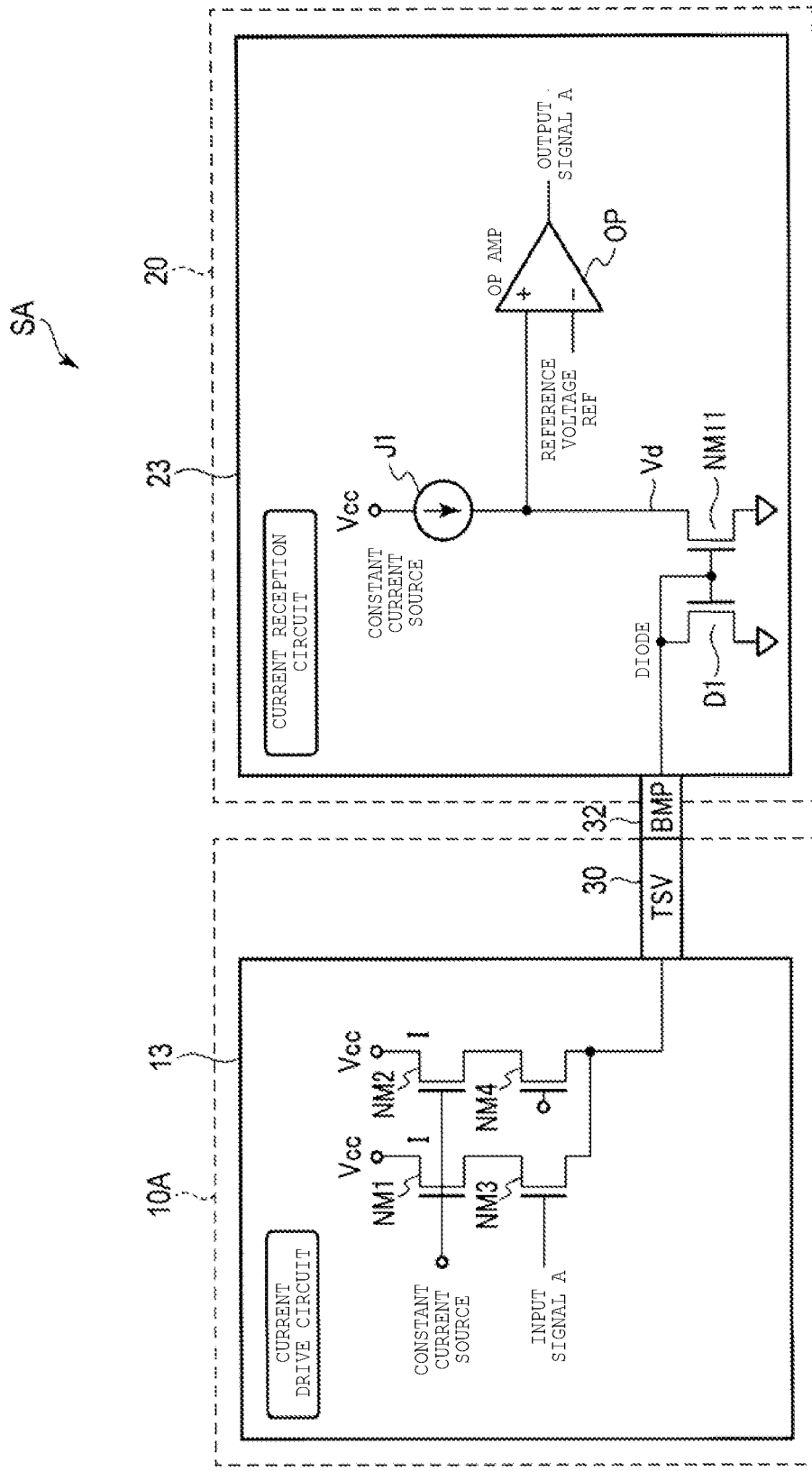
FIG. 19 is a diagram that illustrates a small-amplitude circuit, which uses nMOS transistors, of a semiconductor device according to a fourth embodiment.

FIG. 19 is a diagram that illustrates a small-amplitude circuit SA, which uses nMOS transistors, of the semiconductor device according to the fourth embodiment Differences between the configuration of the current drive circuit 13 illustrated in FIG. 7 and the configuration of a current drive circuit 13 according to the fourth embodiment illustrated in FIG. 19 are in that the diode D1 is removed, and the source terminals of nMOS transistors NM3 and NM4 are connected to a TSV 30. The current drive circuit 13 is formed in a memory chip 10A.

A difference between the configuration of the current reception circuit 23 illustrated in FIG. 7 and the configuration of a current reception circuit 23 according to the fourth embodiment illustrated in FIG. 19 is in that a diode D1 is connected to a TSV 30. More specifically, the TSV 30 is connected to a drain terminal and a gate terminal of an nMOS transistor functioning as the diode D1, and ground voltage Vss is connected to the source terminal of the nMOS transistor.

In addition, the gate terminal of an nMOS transistor NM11 is connected to the drain terminal and the gate terminal of the nMOS transistor functioning as the diode D1. The current reception circuit 23 is formed in an interface chip 20.

4.2 Operation of Small-Amplitude Circuit SA

When an input signal A is "L", the nMOS transistor NM3 is in the Off state. The nMOS transistor NM4 is in the On state. Accordingly, in a case where a signal of the "L" level is input as the input signal A, a current Id1=I flows through the diode D1 of the current reception circuit 23 via the TSV 30.

When the input signal A is "H", the nMOS transistor NM3 is in the On state. The MOS transistor NM4 is in the On state. Accordingly, in a case where a signal of the "H" level is input as the input signal A, a current Id1=2I flows through the diode D1 of the current reception circuit 23 via the TSV 30.

A voltage generated between the drain terminal and the gate terminal of the diode D1 is applied to the gate terminal of the nMOS transistor NM11.

In a case where the input signal A is "L", in other words, in a case where the current Id1 flowing through the diode D1 is I, a current Id2=I×a flows through the nMOS transistor NM11. In a case where the input signal A is "H", in other words, in a case where the current Id1 flowing through the diode D1 is 2I, a current Id2=2I×a flows through the nMOS transistor NM11.

Accordingly, as the output signal A of the operational amplifier OP, in accordance with the voltage (Vd) of the drain terminal of the nMOS transistor NM11, an output signal A="L" is output in a case where the input signal A is "L", and an output signal A="H" is output in a case where the input signal A is "H".

4.3 Effect of Fourth Embodiment

According to the fourth embodiment, since the diode D1 is provided in the current reception circuit 23, the area of the current drive circuit 13 can be decreased.

5. Fifth Embodiment

A small-amplitude circuit SA of a semiconductor device according to a fifth embodiment is used to cause a current to flow through the TSV 30 and performs transmission of a small-amplitude signal of N values.

5.1 Configuration of Small-Amplitude Circuit SA

Figure 20:
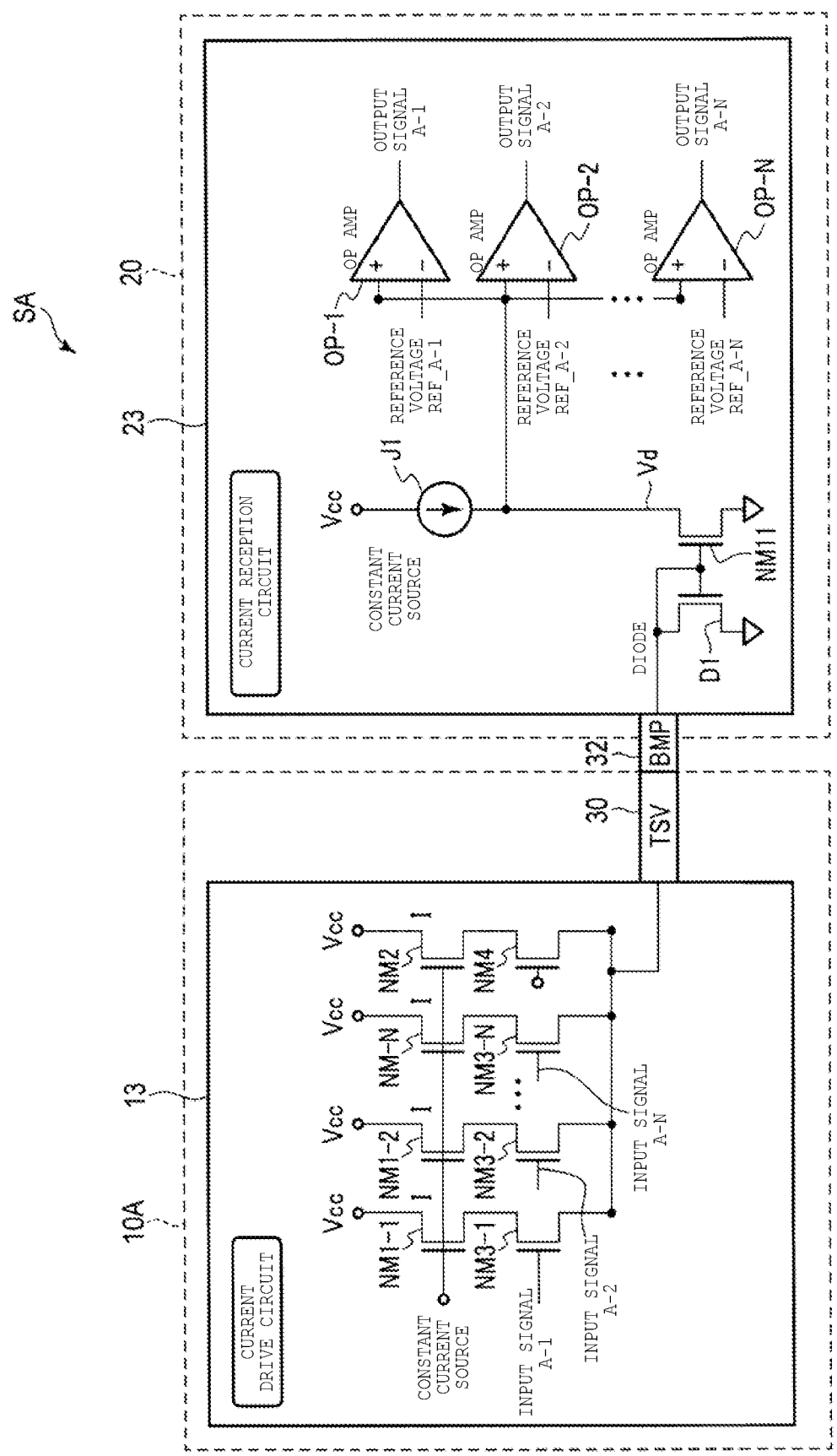
FIG. 20 is a diagram that illustrates a small-amplitude circuit, which uses nMOS transistors, of a semiconductor device according to a fifth embodiment.

FIG. 20 is a diagram that illustrates a small-amplitude circuit SA, which uses nMOS transistors, of the semiconductor device according to the fifth embodiment.

Differences between the configuration of the current drive circuit 13 illustrated in FIG. 18 and the configuration of the current drive circuit 13 according to the fifth embodiment illustrated in FIG. 20 are in that the diode D1 is removed, and source terminals of nMOS transistors NM3 and NM4 are connected to the TSV 30. The current drive circuit 13 is formed in a memory chip 10A.

A difference between the configuration of the current reception circuit 23 illustrated in FIG. 18 and the configuration of a current reception circuit 23 according to the fifth embodiment illustrated in FIG. 20 is in that a diode D1 is connected to the TSV 30. The current reception circuit 23 is formed in an interface chip 20. More specifically, the TSV 30 is connected to the drain terminal and the gate terminal of the nMOS transistor functioning as the diode D1, and the ground voltage Vss is connected to the source terminal of the nMOS transistor.

In addition, the gate terminal of an nMOS transistor NM11 is connected to the drain terminal and the gate terminal of the nMOS transistor functioning as the diode D1.

5.2 Operation of Small-Amplitude Circuit SA

In the current reception circuit 23 of the small-amplitude circuit SA illustrated in FIG. 20, a current flowing through the diode D1 changes according to the input signals A-1 to A-N. For example, in a case where the input signals A-1 to A-N are "L", the nMOS transistors NM3-1 to NM3-N are in the Off state. The nMOS transistor NM4 is in the On state. Accordingly, in a case where signals of the "L" level are input as the input signals A-1 to A-N, a current Id1 flowing through the diode D1 via the TSV 30 is I.

When the input signals A-1 to A-N are "H", the nMOS transistors NM3-1 to NM3-N are in the On state. The MOS transistor NM4 is in the On state. Accordingly, in a case where signals of the "H" level are input as the input signals A-1 to A-N, the current Id1 flowing through the diode D1 via the TSV 30 is (N+1)×I. Similarly, when m input signals (here, m is a positive integer) among the input signals A-1 to A-N are "H", the current Id1 flowing through the diode D1 via the TSV 30 is (m+1)×I. In other words, in accordance with the number of input signals that are in the "H" state among the input signals A-1 to A-N, a current flows through the diode D1.

A voltage generated between the drain terminal and the gate terminal of the diode D1 is applied to the gate terminal of the nMOS transistor NM11.

In a case where the input signals A-1 to A-N are "L", in other words, in a case where the current Id1 flowing through the diode D1 is I, a current Id2=I×a flows through the nMOS transistor NM11. The drain terminal voltage Vd of the nMOS transistor NM11 is a voltage corresponding to the current Id2=I×a. This drain terminal voltage Vd is applied to the positive input terminals of the operational amplifiers OP-1 to OP-N.

The reference electric potentials REF_A-1 to REF_A-N of the operational amplifiers OP-1 to OP-N are set to electric potentials for which the operational amplifiers OP-1 to OP-N can determine the number of "H"s of the input signals A-1 to A-N that are small-amplitude signals. Accordingly, in a case where the input signals A-1 to A-N are "L", the output signals A-1 to A-N="L" are output.

In a case where the input signals A-1 to A-N are "H", in other words, in a case where the current Id1 flowing through the diode D1 is (N+1)×I, a current Id2=(N+1)×I×a flows through the nMOS transistor NM11. The drain terminal voltage Vd of the nMOS transistor NM11 is a voltage corresponding to a current Id2=(N+1)×I×a. This drain terminal voltage Vd is applied to the positive input terminals of the operational amplifiers OP-1 to OP-N. Accordingly, in a case where the input signals A-1 to A-N are "H", the operational amplifiers OP-1 to OP-N output the output signals A-1 to A-N="H".

When m input signals among the input signals A-1 to A-N are "H", the current Id1 flowing through the diode D1 is (m+1)×I. A current Id2=(m+1)×I×a flows through the nMOS transistor NM11. The drain terminal voltage Vd of the nMOS transistor NM11 is a voltage corresponding to a current Id2=(m+1)×I×a. This drain terminal voltage Vd is applied to the positive input terminals of the operational amplifiers OP-1 to OP-N. In a case where m input signals are "H", the output signals A-1 to A-M of m operational amplifiers OP-1 to OP-M are "H", and the output signals A-M+1 to A-N of the operational amplifiers OP-M+1 to OP-N become "L".

5.3 Effect of Fifth Embodiment

According to the fifth embodiment, since the diode D1 is provided in the current reception circuit 23, the area of the current drive circuit 13 can be decreased, and the transmission of the small-amplitude signals of N values can be performed.

6. Sixth Embodiment

In a small-amplitude circuit SA of a semiconductor device according to a sixth embodiment, a TSV 30 is used as a two-way bus, and a current drive circuit 13 and a current reception circuit 23 are formed on a same substrate.

6.1 Configuration of Small-Amplitude Circuit SA

Figure 21:
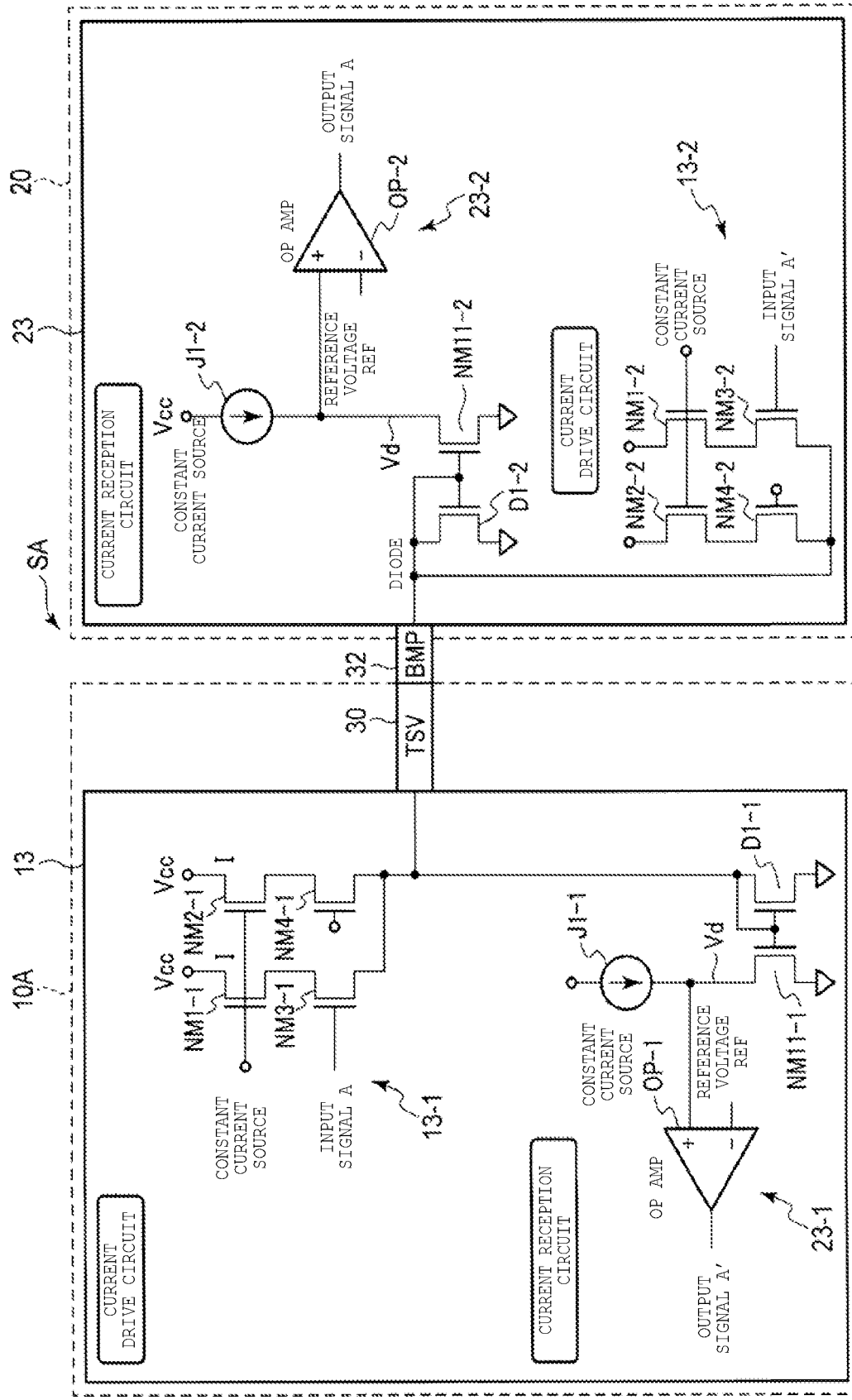
FIG. 21 is a diagram that illustrates a small-amplitude circuit, which uses nMOS transistors, of a semiconductor device according to a sixth embodiment.

FIG. 21 is a diagram that illustrates a small-amplitude circuit SA, which uses nMOS transistors, of the semiconductor device according to the sixth embodiment.

As illustrated in the drawing, in a memory chip 10A, a current drive circuit 13-1 and a current reception circuit 23-1 are formed. Similarly, in an interface chip 20, a current drive circuit 13-2 and a current reception circuit 23-2 are formed.

The current drive circuit 13-1 and the current reception circuit 23-1 of the memory chip 10 are connected to the current drive circuit 13-2 and the current reception circuit 23-2 of the interface chip 20 via the TSV 30 as a two-way bus. The configuration of the current drive circuits 13-1 and 13-2 and the configuration of the current reception circuits 23-1 and 23-2 are the same as the configuration of the current drive circuit 13 according to the fourth embodiment illustrated in FIG. 19.

The source terminals of nMOS transistors NM3-1 and NM4-1 of the current drive circuit 13-1 of the memory chip 10 are connected to the drain terminal of an nMOS transistor functioning as a diode D1-2 of the current reception circuit 23-2 of the interface chip 20 via the TSV 30.

The source terminals of nMOS transistors NM3-2 and NM4-2 of the current drive circuit 13-2 of the interface chip 20 are connected to the drain terminal of an nMOS transistor functioning as a diode D1-1 of the current reception circuit 23-1 of the memory chip 10 via the TSV 30.

In the sixth embodiment, while the small-amplitude circuit SA according to the fourth embodiment is described as an example, the current drive circuit 13 and the current reception circuit 23 of the small amplitude circuit SA according to another embodiment may be formed on a same substrate.

6.2 Operation of Small-Amplitude Circuit SA

When an input signal A for the current drive circuit 13-1 of the memory chip 10 is "L", the nMOS transistor NM3-1 is in the Off state. The nMOS transistor NM4-1 is in the On state. Accordingly, in a case where a signal of the "L" level is input as the input signal A, a current Id1=I flows through a diode D1-2 of the current reception circuit 23-2 of the interface chip 20 via the TSV 30.

When the input signal A for the current drive circuit 13-1 of the memory chip 10 is "H", the nMOS transistor NM3-1 is in the On state. The nMOS transistor NM4-1 is in the On state. Accordingly, in a case where a signal of the "H" level is input as the input signal A, a current Id1=2I flows through the diode D1-2 of the current reception circuit 23-2 of the interface chip 20 via the TSV 30.

A voltage generated between the drain terminal and the gate terminal of the diode D1-2 is applied to the gate terminal of the nMOS transistor NM11-2.

In a case where the input signal A is "L", in other words, in a case where the current Id1 flowing through the diode D1-2 is I, a current Id2=I×a flows through the nMOS transistor NM11-2. On the other hand, in a case where the input signal A is "H", in other words, in a case where the current Id1 flowing through the diode D1-2 is 2I, a current Id2=2I×a flows through the nMOS transistor NM11-2.

Accordingly, as the output signal A of the operational amplifier OP-2, in accordance with the voltage (Vd) of the drain terminal of the nMOS transistor NM11-2, an output signal A="L" is output in a case where the input signal A is "L", and an output signal A="H" is output in a case where the input signal A is "H".

Similarly, when an input signal A' for the current drive circuit 13-2 of the interface chip 20 is "L", the nMOS transistor NM3-2 is in the Off state. The nMOS transistor NM4-2 is in the On state. Accordingly, in a case where a signal of the "L" level is input as the input signal A', a current Id1=I flows through a diode D1-1 of the current reception circuit 23-1 of the memory chip 10 via the TSV 30.

When the input signal A' for the current drive circuit 13-2 of the interface chip 20 is "H", the nMOS transistor NM3-2 is in the On state. The MOS transistor NM4-2 is in the On state. Accordingly, in a case where a signal of the "H" level is input as the input signal A', a current Id1=2I flows through the diode D1-1 of the current reception circuit 23-1 of the memory chip 10 via the TSV 30.

A voltage generated between the drain terminal and the gate terminal of the diode D1-1 is applied to the gate terminal of the nMOS transistor NM11-1.

In a case where the input signal A' is "L", in other words, in a case where the current Id1 flowing through the diode D1-1 is I, a current Id2=I×a flows through the nMOS transistor NM11-1. On the other hand, in a case where the input signal A' is "H", in other words, in a case where the current Id1 flowing through the diode D1-1 is 2I, a current Id2=2I×a flows through the nMOS transistor NM11-1.

Accordingly, as the output signal A' of the operational amplifier OP-1, in accordance with the voltage (Vd) of the drain terminal of the nMOS transistor NM11-1, an output signal A'="L" is output in a case where the input signal A' is "L", and an output signal A'="H" is output in a case where the input signal A' is "H".

In addition, in a case where the current drive circuit 13-1 and the current reception circuit 23-2 are active, the current drive circuit 13-2 and the current reception circuit 23-1 are non-active. In addition, in a case where the current drive circuit 13-2 and the current reception circuit 23-1 are active, the current drive circuit 13-1 and the current reception circuit 23-2 are non-active. The method of controlling the activeness/non-activeness of the current drive circuits 13-1 and 13-2 and the current reception circuits 23-1 and 23-2 is arbitrary. For example, it may be configured such that switches are provided between the current drive circuit 13-1 and the current reception circuit 23-2 and the current drive circuit 13-2 and the current reception circuit 23-1, and these switches are controlled. In addition, the circuit components of the current drive circuits 13-1 and 13-2 and the current reception circuits 23-1 and 23-2 may be controlled.

6.3 Effect of Sixth Embodiment

According to the sixth embodiment, the current drive circuit 13 and the current reception circuit 23 are provided in both the first substrate and the second substrate, and the TSV 30 is used to be common as a two-way bus, whereby the size of the whole small-amplitude circuit SA can be decreased.

7. Modified Example

Figure 22:
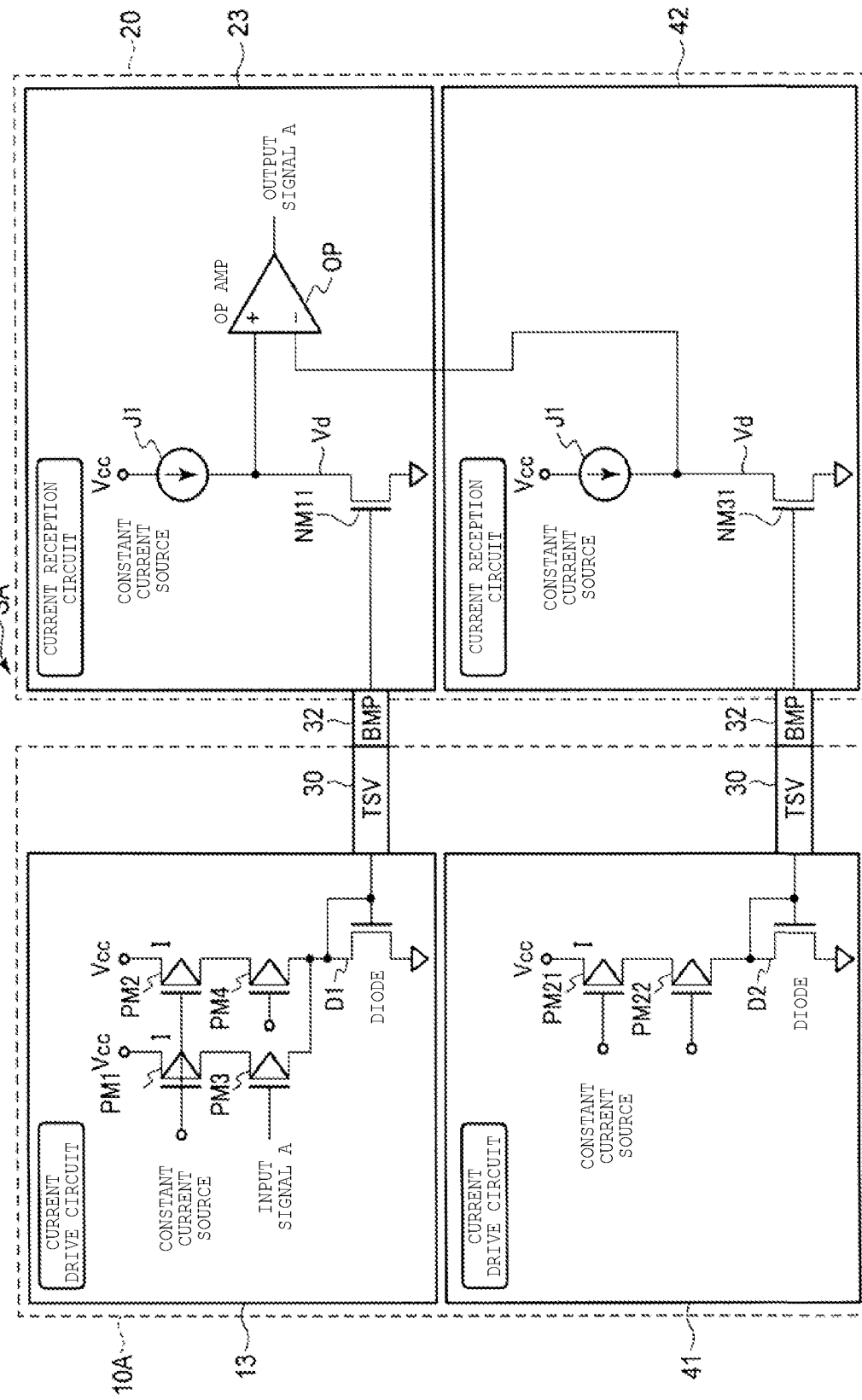
FIG. 22 is a diagram that illustrates a small-amplitude circuit using pMOS transistors in current drive circuits of the semiconductor device according to the second embodiment.
Figure 23:
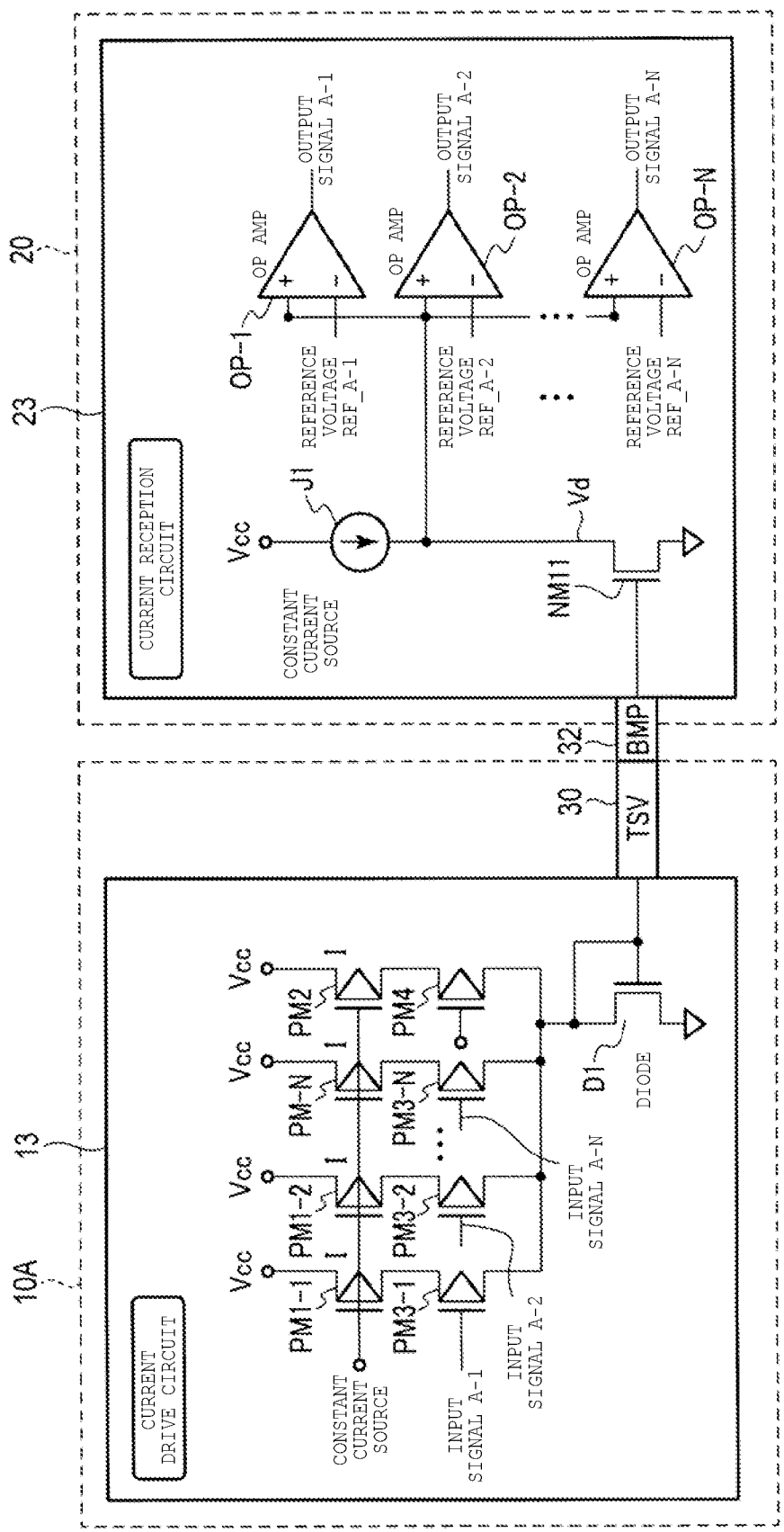
FIG. 23 is a diagram that illustrates a small-amplitude circuit using pMOS transistors in a current drive circuit of the semiconductor device according to the third embodiment.
Figure 24:
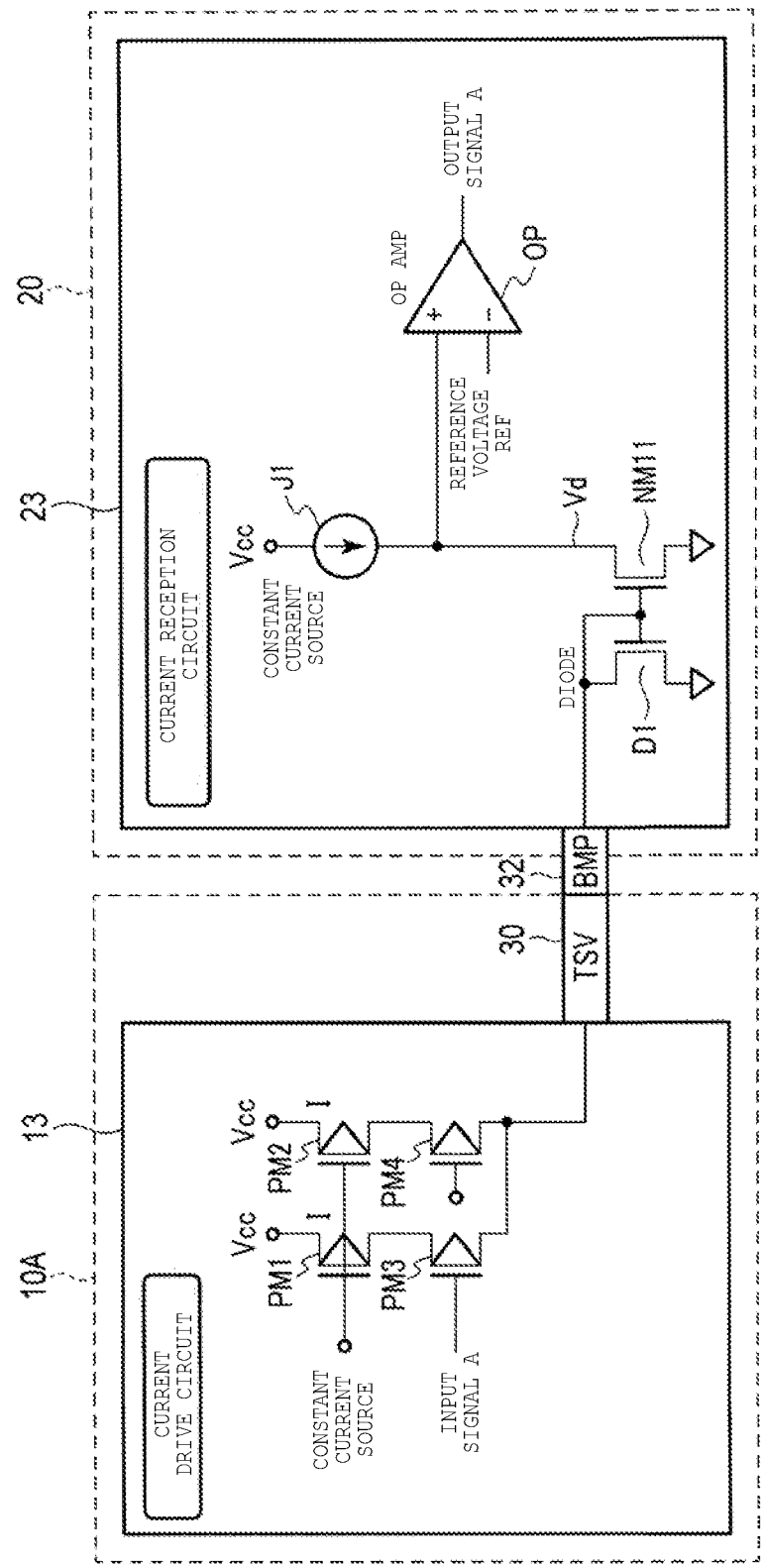
FIG. 24 is a diagram that illustrates a small-amplitude circuit using pMOS transistors in a current drive circuit of the semiconductor device according to the fourth embodiment.
Figure 25:
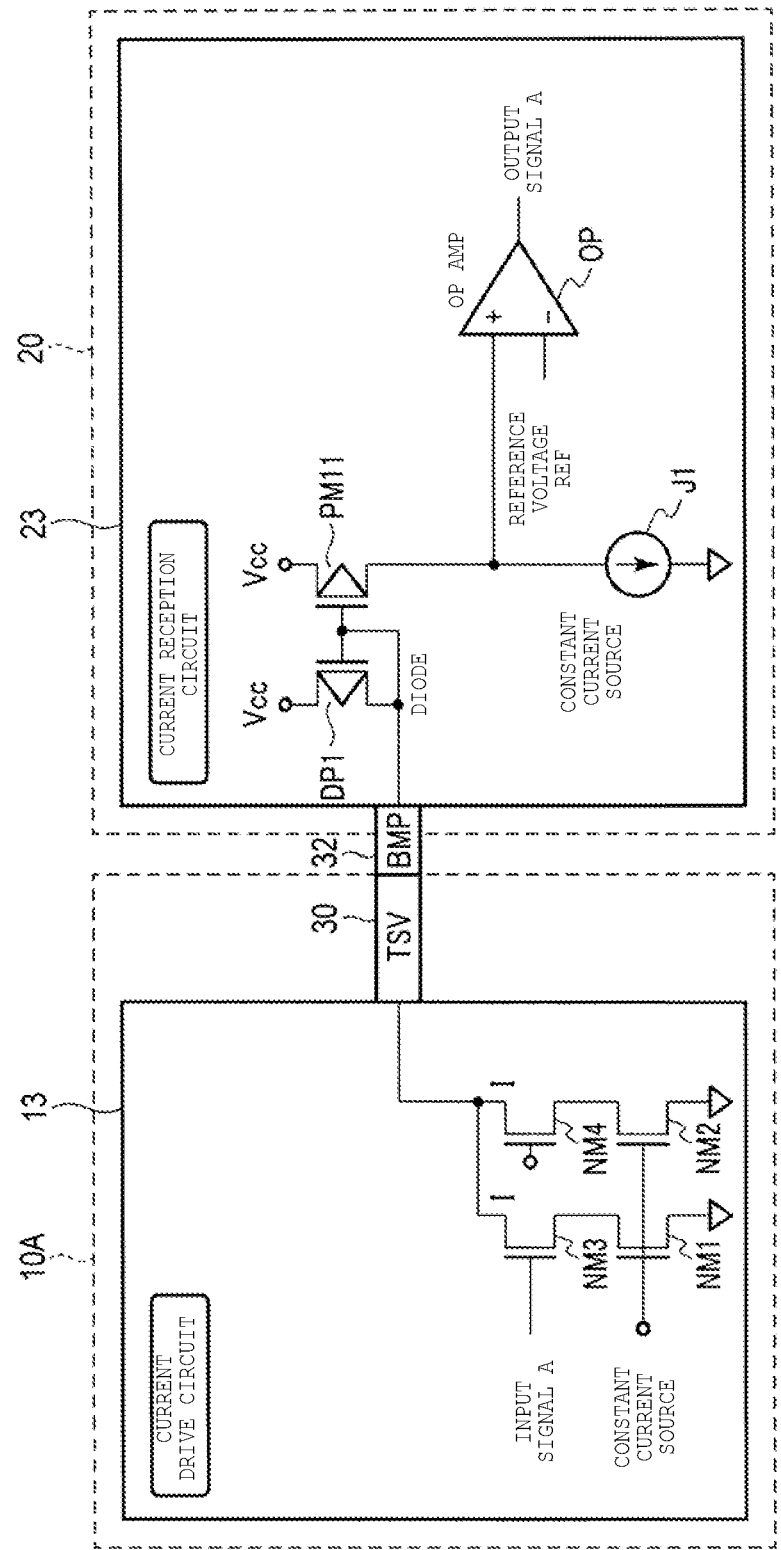
FIG. 25 is a diagram that illustrates a small-amplitude circuit using pMOS transistors in a current reception circuit of the semiconductor device according to the fourth embodiment.
Figure 26:
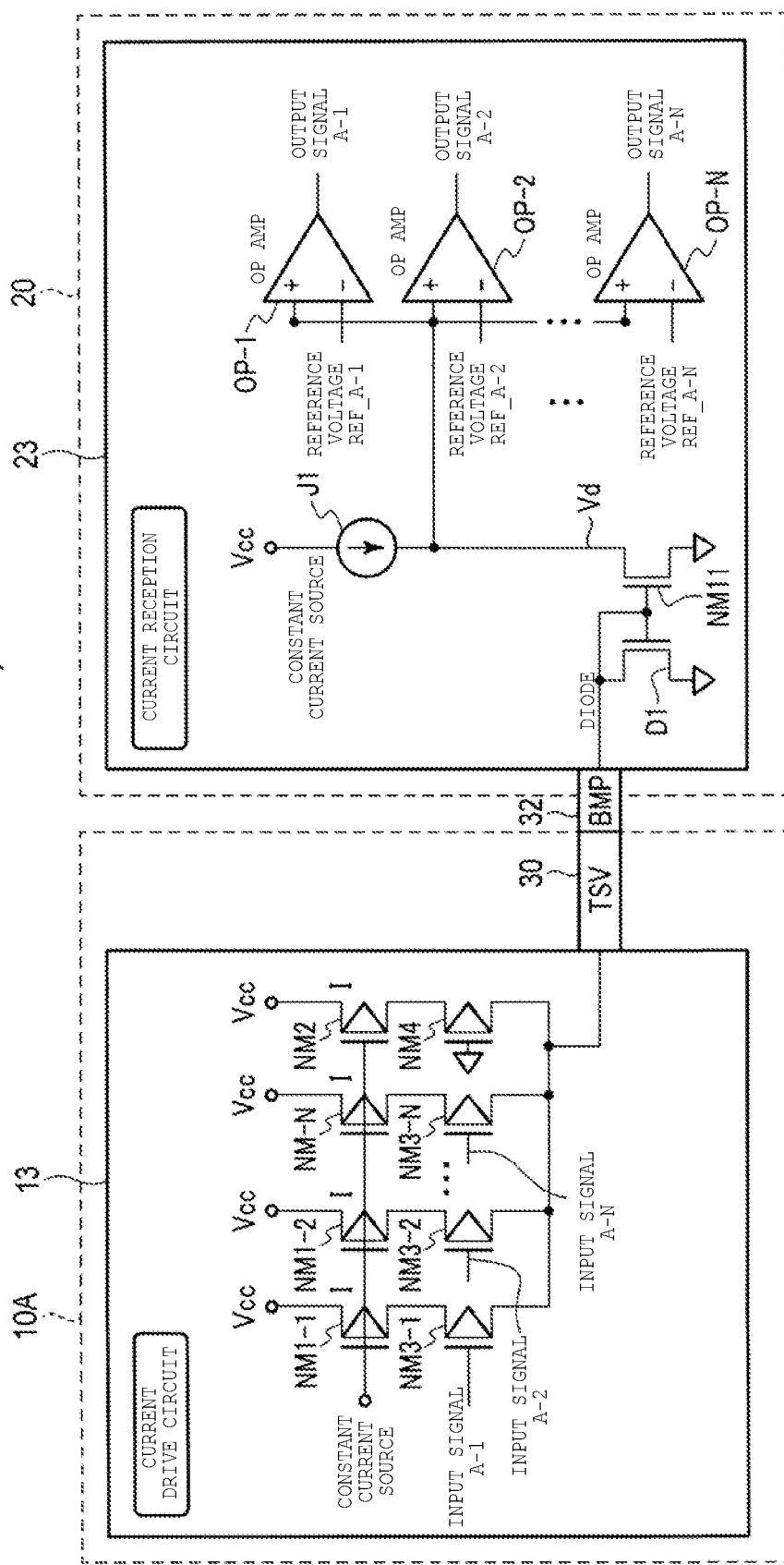
FIG. 26 is a diagram that illustrates a small-amplitude circuit using pMOS transistors in a current drive circuit of the semiconductor device according to the fifth embodiment.
Figure 27:
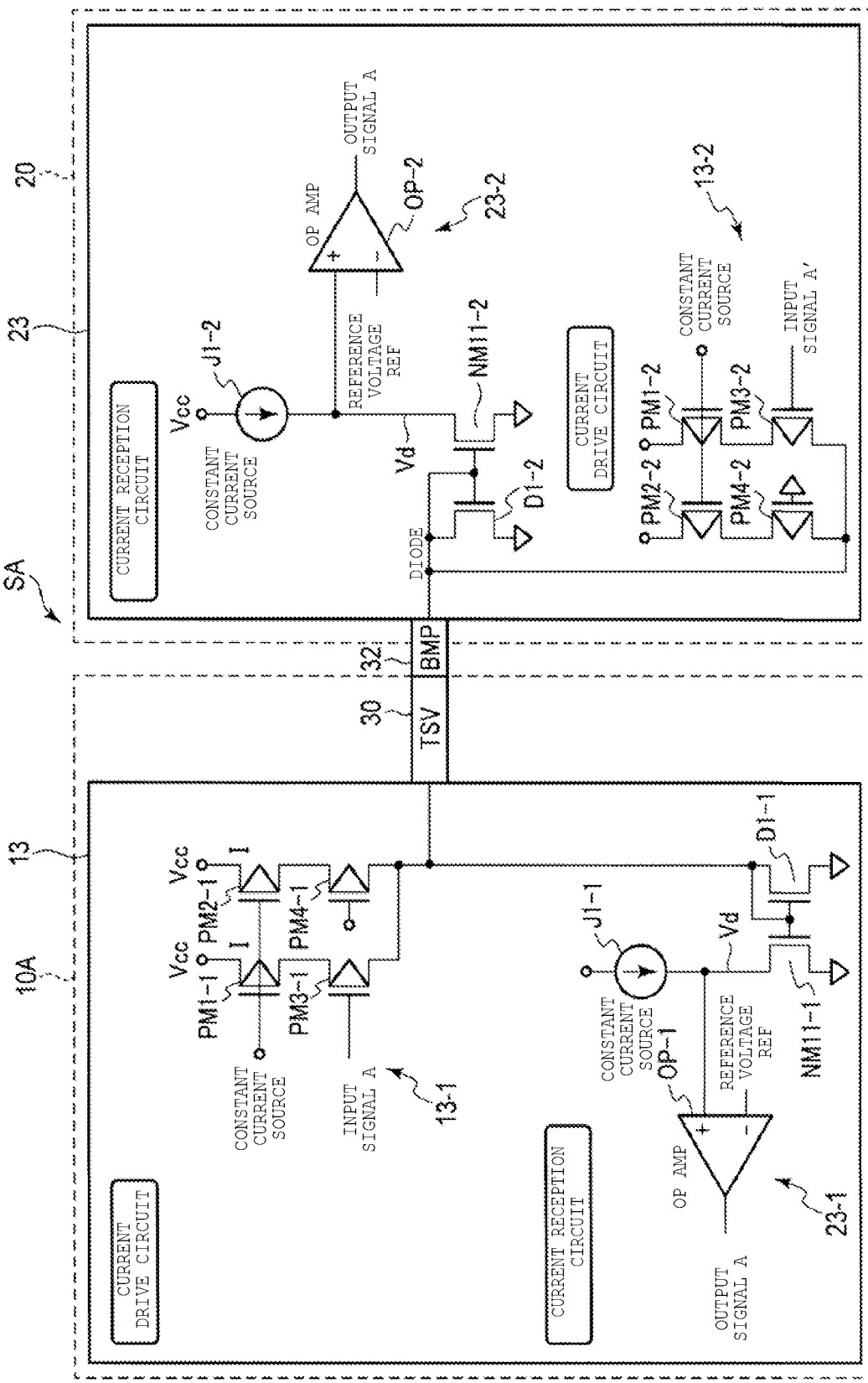
FIG. 27 is a diagram that illustrates a small-amplitude circuit using pMOS transistors in a current drive circuit and a current reception circuit of the semiconductor device according to the sixth embodiment.

In the second embodiment to the sixth embodiment, while nMOS transistors are described as an example, as illustrated in FIGS. 22 to 27, pMOS transistors may be used. FIG. 22 is a diagram that illustrates a small-amplitude circuit SA using pMOS transistors in the current drive circuits 13 and 41 of the semiconductor device according to the second embodiment illustrated in FIG. 17. FIG. 23 is a diagram that illustrates a small-amplitude circuit SA using pMOS transistors in the current drive circuit 13 of the semiconductor device according to the third embodiment illustrated in FIG. 18. FIG. 24 is a diagram that illustrates a small-amplitude circuit SA using pMOS transistors in the current drive circuit 13 of the semiconductor device according to the fourth embodiment illustrated in FIG. 19. FIG. 25 is a diagram that illustrates a small-amplitude circuit SA using pMOS transistors in the current reception circuit 23 of the semiconductor device according to the fourth embodiment illustrated in FIG. 19. FIG. 26 is a diagram that illustrates a small-amplitude circuit SA using pMOS transistors in the current drive circuit 13 of the semiconductor device according to the fifth embodiment illustrated in FIG. 20. FIG. 27 is a diagram that illustrates a small-amplitude circuit SA using pMOS transistors in the current drive circuit 13 and the current reception circuit 23 of the semiconductor device according to the sixth embodiment illustrated in FIG. 21.

In the embodiments, while the memory chip, for example, has been described to include a NAND flash memory, the embodiments are not limited thereto but may be applied to any other nonvolatile memory or a volatile memory. In addition, the embodiments may be applied to various kinds of semiconductor integrated circuits.

In addition, it may be configured such that the current drive circuit 13 and the current reception circuit 23 are provided in a same semiconductor chip, and the TSV 30 is a wiring layer provided in the semiconductor chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first circuit configured to generate a current corresponding to an input signal;
   a second circuit configured to generate a voltage corresponding to the current generated by the first circuit;
   a transmission line to which the voltage corresponding to the current generated by the first circuit is applied;
   a constant current source;
   a transistor that includes a drain terminal receiving a current from the constant current source and a gate terminal that receives the current generated by the first circuit through the transmission line; and
   an amplification circuit configured to amplify a difference voltage between a drain voltage of the transistor and a reference voltage and output the amplified difference voltage as an output signal corresponding to the input signal,
   wherein the transmission line is a first through-silicon-via connectable to a second through-silicon-via.

2. The semiconductor device according to claim 1, wherein the second circuit includes a diode having a first terminal receiving the current and a second terminal electrically connected to ground, and the voltage at the first terminal is the voltage corresponding to the current generated by the first circuit.

3. The semiconductor device according to claim 2, wherein the first terminal of the diode and the gate terminal of the transistor are electrically connected through the transmission line.

4. The semiconductor device according to claim 3, wherein
   the first circuit includes a first constant current source, a second constant current source, a first transistor between the first constant current source and the diode and a second transistor between the second constant current source and the diode, and
   the input signal being supplied to a gate terminal of the first transistor and a constant signal being supplied to a gate terminal the second transistor, such that a first current flows to the diode when the input signal is at a first level and a second current flows to the diode when the input signal is at a second level.

5. The semiconductor device according to claim 1, further comprising:
   a third circuit configured to generate a voltage from a current;
   a second constant current source; and
   a fourth circuit configured to generate the reference voltage based on the voltage generated by the third circuit and a current supplied from the second constant current source.

6. A semiconductor device comprising:
   a first semiconductor chip having a first circuit configured to generate a current corresponding to the input signal; and a second semiconductor chip having a second circuit configured to generate a voltage corresponding to the current generated by the first circuit, a constant current source, a transistor that includes a drain terminal receiving a current from the constant current source and a gate terminal to which the voltage corresponding to the current generated by the first circuit is applied, and an amplification circuit configured to amplify a difference voltage between a drain voltage of the transistor and a reference voltage and output the amplified difference voltage as an output signal corresponding to the input signal, wherein the first semiconductor chip is one of a plurality of stacked semiconductor chips each having a through-silicon-via electrically connected to a through-silicon-via of each of other stacked semiconductor chips, and the current is supplied from the first circuit to the second circuit through the through-silicon-via of at least one of the stacked semiconductor chips.

7. The semiconductor device according to claim 6, wherein the second circuit includes a diode having a first terminal receiving the current and a second terminal electrically connected to ground, and the voltage at the first terminal is the voltage corresponding to the current generated by the first circuit.

8. The semiconductor device according to claim 7, wherein the current is supplied from the first circuit to the diode through the through-silicon-via of the at least one of the stacked semiconductor chips.

9. A semiconductor device comprising:
a first semiconductor chip having a first circuit configured to generate a current corresponding to the input signal, and a second circuit configured to generate a voltage corresponding to the current generated by the first circuit; and
a second semiconductor chip having a constant current source, a transistor that includes a drain terminal receiving a current from the constant current source and a gate terminal to which the voltage corresponding to the current generated by the first circuit is applied, and an amplification circuit configured to amplify a difference voltage between a drain voltage of the transistor and a reference voltage and output the amplified difference voltage as an output signal corresponding to the input signal,
wherein the first semiconductor chip is one of a plurality of stacked semiconductor chips each having a through-silicon-via electrically connected to a through-silicon-via of each of other stacked semiconductor chips.

10. The semiconductor device according to claim 9, further comprising:
a transmission line electrically connecting the first and second semiconductor chips,
wherein the voltage corresponding to the current generated by the first circuit is applied to the gate terminal of the transistor through the transmission line.

11. The semiconductor device according to claim 10, wherein the second circuit includes a diode having a first terminal receiving the current and a second terminal electrically connected to ground, and the voltage at the first terminal is the voltage corresponding to the current generated by the first circuit.

12. The semiconductor device according to claim 11, wherein the first terminal of the diode and the gate terminal of the transistor are electrically connected through the transmission line.

13. The semiconductor device according to claim 12, wherein
the first circuit includes a first constant current source, a second constant current source, a first transistor between the first constant current source and the diode and a second transistor between the second constant current source and the diode, and
the input signal being supplied to a gate terminal of the first transistor and a constant signal being supplied to a gate terminal the second transistor, such that a first current flows to the diode when the input signal is at a first level and a second current flows to the diode when the input signal is at a second level.

14. The semiconductor device according to claim 9, wherein the first semiconductor chip further includes a third circuit configured to generate a voltage from a current, and the second semiconductor chip further includes a second constant current source and a fourth circuit configured to generate the reference voltage based on the voltage generated by the third circuit and a current supplied from the second constant current source.

15. The semiconductor device according to claim 9, wherein the first and second circuits are formed on a same semiconductor substrate.

16. The semiconductor device according to claim 9, wherein the voltage corresponding to the current generated by the first circuit is applied to the gate terminal of the transistor through the through-silicon-via of at least one of the stacked semiconductor chips.

17. The semiconductor device according to claim 9, wherein the first semiconductor chip is a memory chip, and the second semiconductor chip is an interface chip.

18. The semiconductor device according to claim 9, wherein the first semiconductor chip is an interface chip and the second semiconductor chip is a memory chip.

* * * * *